(12) United States Patent
Parakulam et al.

(10) Patent No.: US 9,106,980 B2
(45) Date of Patent: Aug. 11, 2015

(54) COMMUNICATIONS SYSTEM

(75) Inventors: Gopalakrishnan R. Parakulam, Cupertino, CA (US); Omkar G. Prabhu, San Jose, CA (US); Veluchamy Rasu, Fremont, CA (US); Sunil Bhat, Haryana (IN)

(73) Assignee: Imergy Power Systems, Inc., Fremont, CA (US)

( * ) Notice: Subject to any disclaimer, the term of this patent is extended or adjusted under 35 U.S.C. 154(b) by 284 days.

(21) Appl. No.: 13/084,381

(22) Filed: Apr. 11, 2011

(65) Prior Publication Data

US 2012/0185187 A1     Jul. 19, 2012

(30) Foreign Application Priority Data

Jan. 13, 2011 (IN) .............................. 111/CHE/2011

(51) Int. Cl.
*H04Q 9/00* (2006.01)
*G01R 31/36* (2006.01)

(52) U.S. Cl.
CPC .............. *H04Q 9/00* (2013.01); *G01R 31/3689* (2013.01); *H04Q 2209/30* (2013.01); *H04Q 2209/40* (2013.01); *H04Q 2209/826* (2013.01)

(58) Field of Classification Search
CPC .............. H04Q 9/00; H04Q 2011/005; H04Q 2011/0064; G01R 31/36; G01R 31/3606; G01R 31/3689
USPC .......................................................... 702/63
See application file for complete search history.

(56) References Cited

U.S. PATENT DOCUMENTS

| 4,975,904 | A  | * | 12/1990 | Mann et al. ................... 370/389 |
| 7,123,141 | B2 |   | 10/2006 | Contestabile |
| 7,312,703 | B2 |   | 12/2007 | Hoogenboom |
| 7,378,962 | B2 |   | 5/2008  | Odenwald et al. |
| 7,683,776 | B2 |   | 3/2010  | Glenn et al. |
| 7,702,739 | B1 | * | 4/2010  | Cheng et al. .................. 709/207 |
| 7,855,005 | B2 |   | 12/2010 | Sahu |
| 7,919,204 | B2 |   | 4/2011  | Sahu |
| 7,927,731 | B2 |   | 4/2011  | Sahu |
| 2001/0056425 | A1 | * | 12/2001 | Richard .......................... 707/10 |
| 2005/0071093 | A1 |   | 3/2005  | Stefan |
| 2008/0141244 | A1 | * | 6/2008  | Kelley ........................... 717/178 |
| 2008/0160906 | A1 | * | 7/2008  | Ranjan et al. ................ 455/3.01 |
| 2009/0012633 | A1 |   | 1/2009  | Liu et al. |
| 2009/0144001 | A1 |   | 6/2009  | Leonard et al. |
| 2009/0218984 | A1 |   | 9/2009  | Parakulam |

(Continued)

FOREIGN PATENT DOCUMENTS

WO    WO 2010/138951 A2    12/2010

OTHER PUBLICATIONS

PCT International Search Report and Written Opinion mailed Mar. 28, 2012, in related International Application No. PCT/US2012/021119.

(Continued)

*Primary Examiner* — Mischita Henson
(74) *Attorney, Agent, or Firm* — Haynes and Boone LLP

(57) ABSTRACT

An apparatus and method for monitoring energy storage devices is disclosed. A monitoring system that monitors an energy storage device collects and stores operating data from the device and relays that data through a communications system to one or more servers. The servers can store the operating data from each of the monitored energy storage devices.

22 Claims, 14 Drawing Sheets

(56) References Cited

U.S. PATENT DOCUMENTS

| | | |
|---|---|---|
| 2010/0003586 A1 | 1/2010 | Sahu |
| 2010/0089480 A1 | 4/2010 | Sahu et al. |
| 2010/0090651 A1 | 4/2010 | Sahu et al. |
| 2010/0092757 A1 | 4/2010 | Nair et al. |
| 2010/0092807 A1 | 4/2010 | Sahu et al. |
| 2010/0092813 A1 | 4/2010 | Sahu |
| 2010/0092843 A1 | 4/2010 | Conway |
| 2010/0094468 A1 | 4/2010 | Sahu et al. |
| 2010/0136455 A1 | 6/2010 | Winter |
| 2010/0143781 A1 | 6/2010 | Keshavarz et al. |
| 2010/0261070 A1 | 10/2010 | Keshavarz et al. |
| 2011/0070483 A1 | 3/2011 | Keshavarz et al. |
| 2011/0074357 A1 | 3/2011 | Parakulam et al. |
| 2011/0076526 A1 | 3/2011 | Zu et al. |
| 2011/0079074 A1 | 4/2011 | Sahu |
| 2011/0080143 A1 | 4/2011 | Parakulam et al. |
| 2011/0081561 A1 | 4/2011 | Keshavarz et al. |
| 2011/0081562 A1 | 4/2011 | Parakulam et al. |
| 2011/0086247 A1 | 4/2011 | Keshavarz et al. |
| 2012/0040216 A1 | 2/2012 | Parakulam |

OTHER PUBLICATIONS

International Preliminary Report on Patentability and the Written Opinion mailed Jul. 25, 2013, in related International Application No. PCT/US2012/021119.

Extended European Search Report and Search Opinion mailed Feb. 23, 2015, in related European Application No. 12733983.6.

* cited by examiner

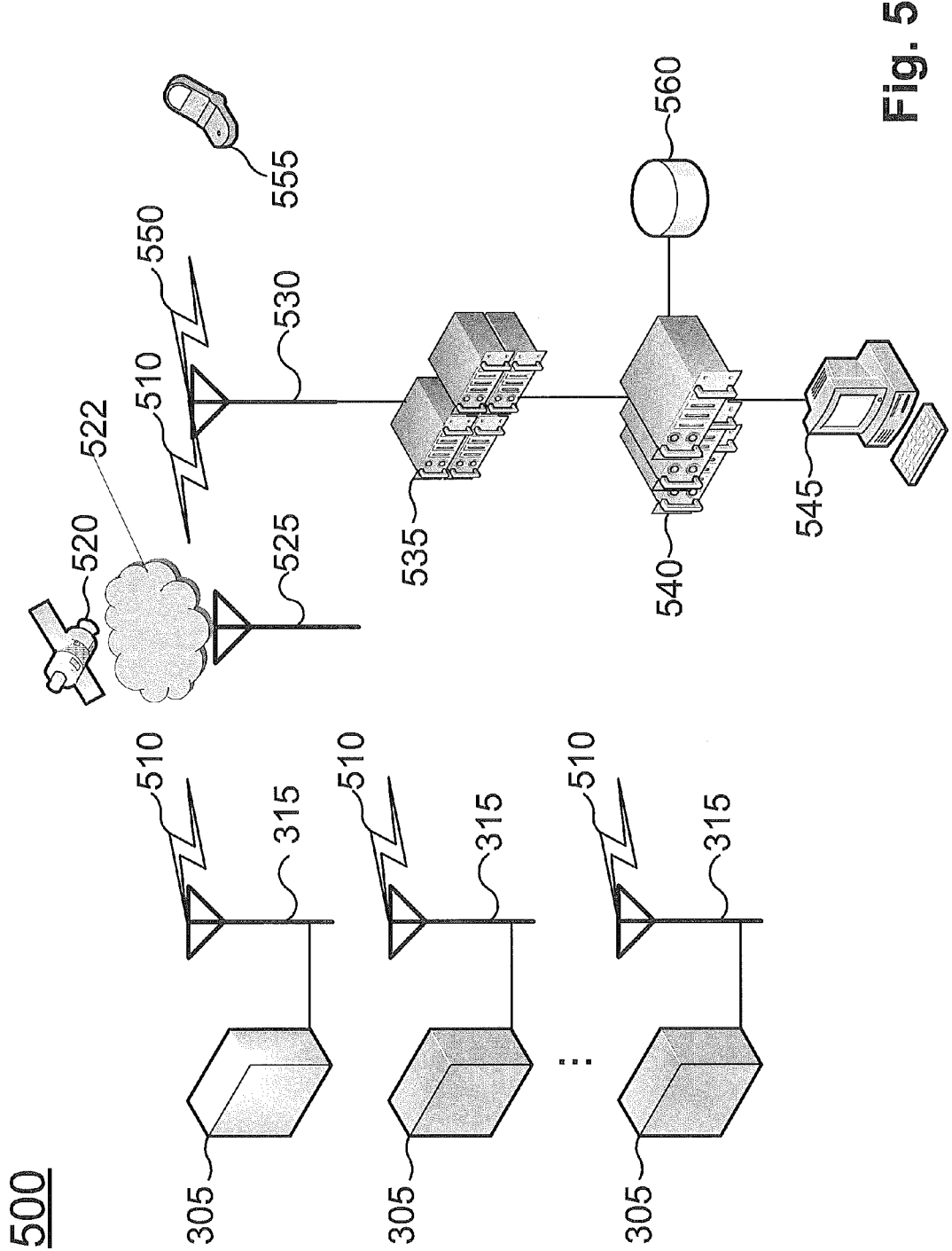

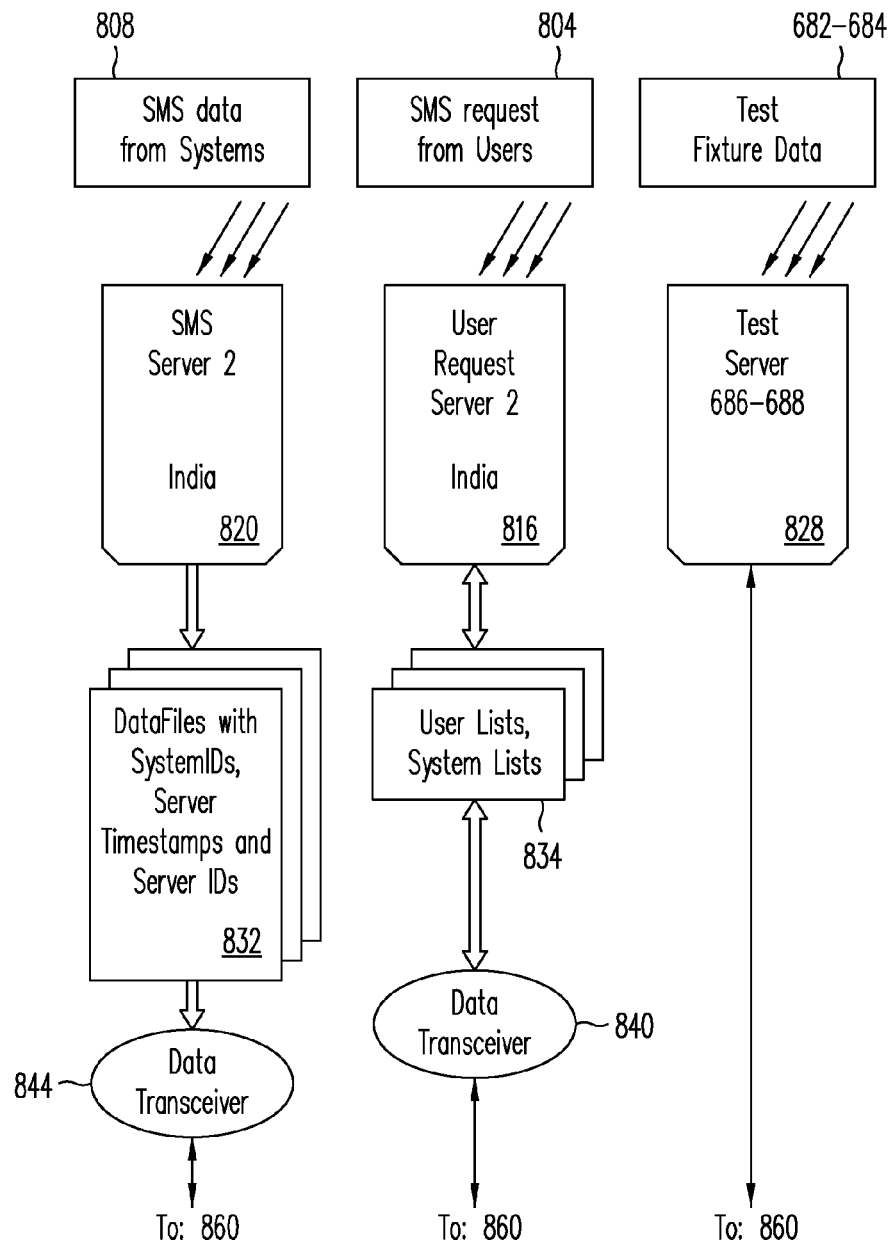
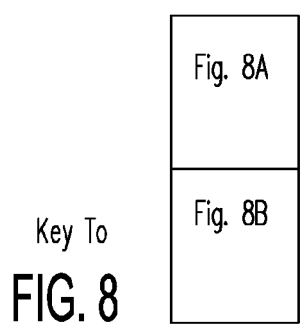
FIG. 8B
Key To FIG. 8

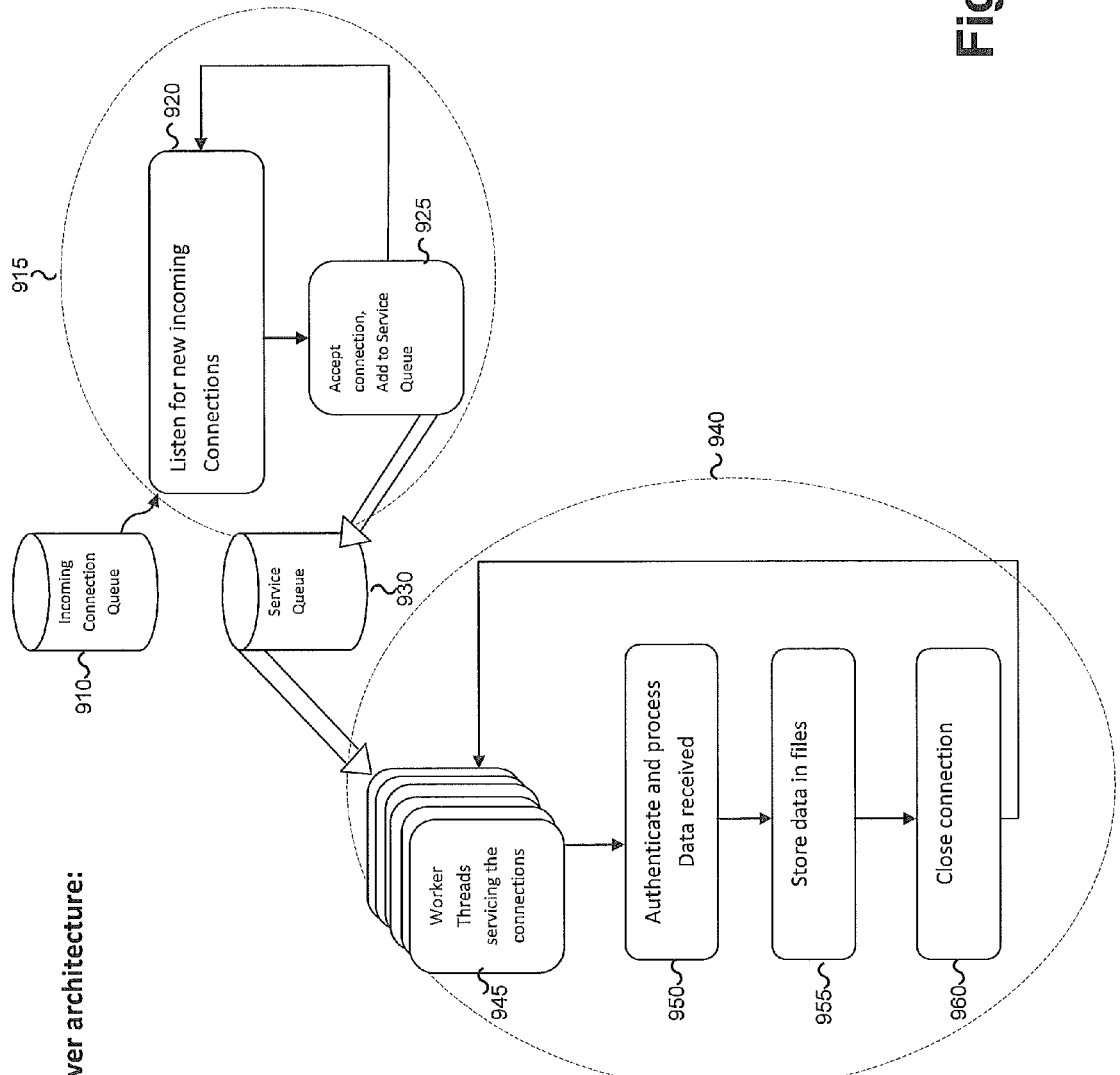

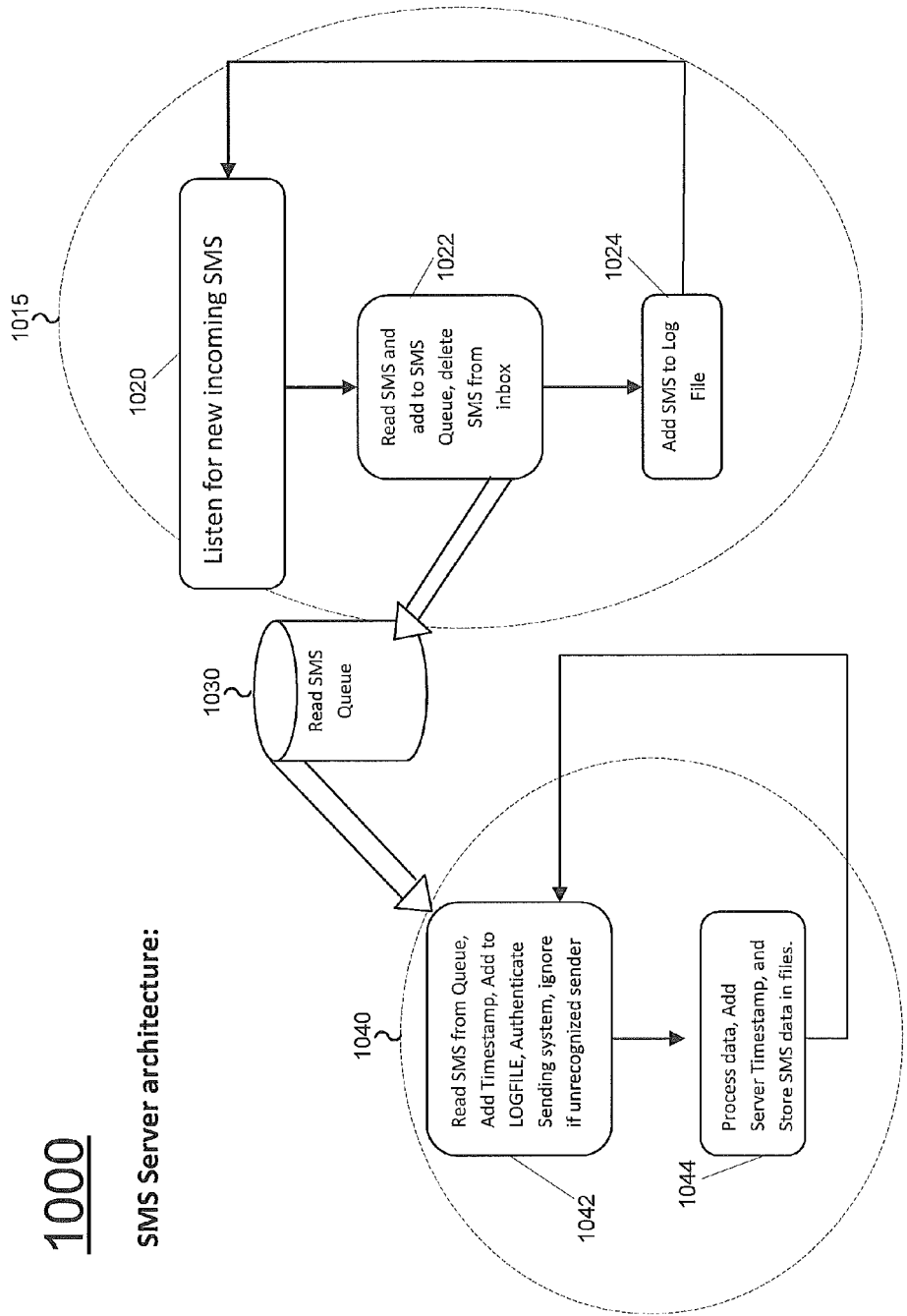

COMMUNICATIONS SYSTEM

REFERENCE TO RELATED APPLICATIONS

This application claims priority to Indian Patent Application No. 111/CHE/2011 entitled, "COMMUNICATIONS SYSTEM", filed on Jan. 13, 2011, and all the benefits accruing therefrom under 35 U.S.C. 371, the contents of which are herein incorporated by reference in its entirety.

BACKGROUND

1. Technical Field

Embodiments of the present invention relate to communications systems, and more specifically to a communication system for a flow cell battery.

2. Discussion of Related Art

Reduction-oxidation (redox) flow batteries store electrical energy in a chemical form, and subsequently dispense the stored energy in an electrical form via a spontaneous reverse redox reaction. A redox flow battery is an electrochemical storage device in which an electrolyte containing one or more dissolved electro-active species flows through a reactor cell where chemical energy is converted to electrical energy. Conversely, the discharged electrolyte can be flowed through a reactor cell such that electrical energy is converted to chemical energy. Electrolyte is stored externally, for example in tanks, and flowed through a set of cells where the electrochemical reaction takes place. Externally stored electrolytes can be flowed through the battery system by pumping, gravity feed, or by any other method of moving fluid through the system. The reaction in a flow battery is reversible; the electrolyte can be recharged without replacing the electroactive material. The energy capacity of a redox flow battery, therefore, is related to the total electrolyte volume (i.e., the size of the storage tank). The discharge time of a redox flow battery at full power also depends on electrolyte volume and can vary from several minutes to many days.

The minimal unit that performs the electrochemical energy conversion is generally called a "cell," whether in the case of flow batteries, fuel cells, or secondary batteries. A device that integrates many such cells, coupled electrically in series and/or parallel to get higher current, voltage, or both, is generally called a "battery." However, it is common to refer to any collection of coupled cells, including a single cell used on its own, as a battery. As such, a single cell can be referred to interchangeably as a "cell" or a "battery."

Redox flow batteries can be utilized in many technologies that require the storage of electrical energy. For example, redox flow batteries can be utilized to store night-time electricity that is inexpensive to produce, and to subsequently provide electricity during peak demand when electricity is more expensive to produce or demand is beyond the capability of current production. Such batteries can also be utilized for storage of green energy (i.e., energy generated from renewable sources such as wind, solar, wave, or other non-conventional sources). Flow redox batteries can be utilized as uninterruptible power supplies in place of more expensive backup generators. Efficient methods of power storage can be used to construct devices having a built-in backup that mitigates the effects of power cuts or sudden power failures. Power storage devices can also reduce the impact of a failure in a generating station.

Therefore, there is a need for better flow-cell batteries and for better monitoring of flow cell batteries.

SUMMARY

Embodiments of the present invention provide a method and apparatus for operating a communications system. In accordance with some embodiments of the present invention, a monitoring system includes a microprocessor coupled to receive data from an energy storage device and from external sensors; a communications device coupled to the microprocessor, the communications device coupled to communicate data between the microprocessor and an external network of servers; and memory coupled to the microprocessor to store data.

Further, a communications system according to some embodiments of the present invention can include a server system coupled to receive data from one or more monitoring systems coupled to an energy storage device; and a data base coupled to the server system, wherein data from the energy storage device is stored in the data base.

These and other embodiments of the invention are further described below with respect to the following figures.

BRIEF DESCRIPTION OF THE DRAWINGS

FIG. 5 is a simplified block diagram of a communications system for a system according to some embodiments of the present invention.

FIG. 9 is a simplified block diagram of a GPRS server architecture according to some embodiments of the present invention.

FIG. 10 is simplified block diagram of an SMS server architecture consistent with some embodiments of the present invention.

Figure 1:
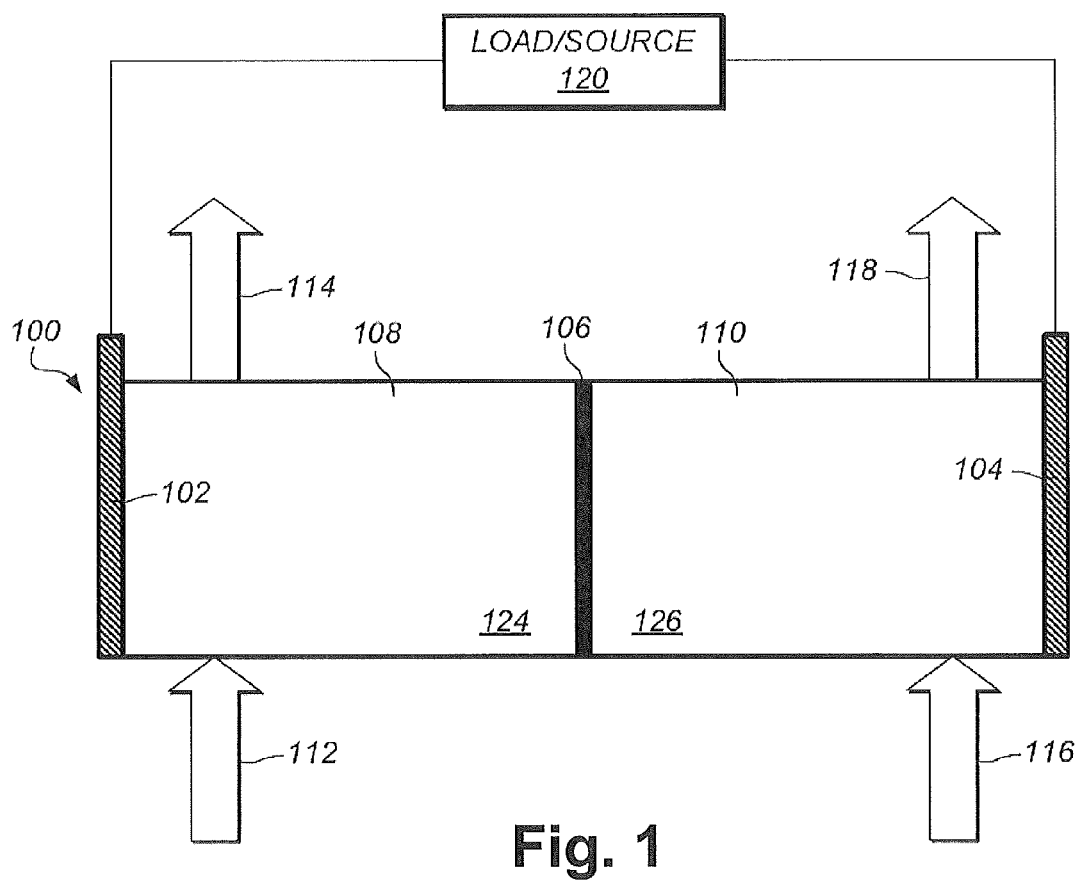
FIG. 1 illustrates a reduction-oxidation (redox) cell according to some embodiments of the present invention.

In the figures, elements having the same designation have the same or similar functions. The figures are illustrative only and relative sizes and distances depicted in the figures are for convenience of illustration only and have no further meaning.

DETAILED DESCRIPTION

In the following description, for the purposes of explanation, specific details are set forth in order to provide a thorough understanding of some embodiments of the invention. However, it will be apparent that the invention may be practiced without these specific details.

Complex systems, for example reduction-oxidation (redox) battery systems, integrate complex electrical, mechanical, and chemical components. To operate such a complex system efficiently and reliably, collecting and analyzing information throughout the life of the system and its constituent parts, from manufacturing to operation in the field, can be beneficial. Before a system is assembled, important information about components can be collected and stored during testing. Once subsystems are assembled from components and systems assembled from components, important information recorded during testing can also be collected. Once a complete system is operating in the field, operational data can be collected.

System performance can be determined from data collected and analyzed from a complete system operating in the field. Such performance information can be useful for demonstrating value (e.g., cost savings) to current and potential buyers. Changes in metrics can be used to identify and remedy sub-optimal operation and predict failures. For example, if a redox flow cell battery goes out of balance, an electrolyzer can be activated to restore balance. Once a component or subsystem is identified as the source of suboptimal operation or even failure, its complete history back to manufacturing can be analyzed. Components in other systems manufactured and/or operated at the same time, same revision, under the same conditions, using the same methods, etc. as the failing component can be identified and proactively remedied (e.g., during the next regularly scheduled maintenance instead of a costly unscheduled emergency service visit).

As used in the present specification, the following words and phrases are generally intended to have the meanings as set forth below, except to the extent that the context in which they are used indicates otherwise.

As described herein, the term "cell" refers generally to any unit capable of performing electrochemical energy conversion. Exemplary cells include, but are not limited to, redox flow batteries, fuel cells, and secondary batteries.

As described herein, the term "membrane" refers to any material that forms a barrier between fluids, for example between electrochemical half-cells (e.g., an anode compartment and a cathode compartment). Exemplary membranes may be selectively permeable, and may include porous membranes and ion-selective membranes. Exemplary membranes may include one or more layers, wherein each layer exhibits a selective permeability for certain species (e.g., ions), and/or affects the passage of certain species.

As described herein, the term "fluid communication" refers to structures which are in contact with, but not necessarily affixed to, one another, whereby a fluid or gas can pass from one structure to the other. For example, two structures may be in fluid communication with one another by a channel, conduit, opening, and/or valve, even if the communication includes a valve in a closed state but provided that the valve may be opened, whereby a fluid or gas may be moved from one of the structures to the other. In addition, two structures may be considered to be in fluid communication with each other even in circumstances where one or more intermediate structures divert and/or interrupt the flow of the fluid or gas from the first structure to the second structure, so long as flow of the fluid or gas from the one or more intermediate structures to the second structure is ultimately possible.

As described herein, the "chromium side" of a cell refers generally to the negative side of a Cr/Fe based redox flow cell. In some embodiments, the oxidation of chromium occurs at the chromium side of the cell.

As described herein, the "iron side" of a cell refers generally to the positive side of a Cr/Fe based redox flow cell. In some embodiments, the reduction of iron occurs at the iron side of the cell.

There are many reasons for monitoring the operation of a flow cell battery. Those reasons include that the flow battery has pumps to deliver the electrolyte to the reactor cell, which can be monitored to detect early failure. Further, the Electrolyte can leak causing damage to the system and a system shutdown. Additionally, the flow cell system might deteriorate over a period of time, a process that can be monitored and mitigated. The overall performance of the System can be monitored to access the health of the system. Electronic subsystems can be monitored to determine, predict, and prevent failures of the system. The system performance can be monitored and fine tuned by sending commands to achieve better efficiency.

FIG. 1 illustrates a schematic drawing of a simplified redox flow cell battery system 100. As shown, redox flow cell system includes redox flow cell 100, which includes two half-cells 108 and 110 separated by a membrane 106. An electrolyte 124 is flowed through half-cell 108 and an electrolyte 126 is flowed through half-cell 110. Half-cells 108 and 110 include electrodes 102 and 104, respectively, in contact with electrolytes 124 and 126, respectively, such that redox reactions occur at the surface of the electrodes 102 or 104. In some embodiments, multiple redox flow cells 100 may be electrically coupled (e.g., stacked) either in series to achieve higher voltage or in parallel in order to achieve higher current. The stacked cells are collectively referred to as a battery stack and flow cell battery can refer to a single cell or battery stack. As shown in FIG. 1, electrodes 102 and 104 are coupled across load/source 120, through which electrolytes 124 and 126 are either charged or discharged.

When filled with electrolyte, half-cell 110 of redox flow cell 100 contains anolyte 126 and the other half-cell 108 contains catholyte 124, the anolyte and catholyte being collectively referred to as electrolytes. Reactant electrolytes may be stored in separate reservoirs and dispensed into half-cells 108 and 110 via conduits coupled to cell inlet/outlet (I/O) ports 112, 114 and 116, 118 respectively. In some embodiments, an external pumping system is used to transport the electrolytes to and from the redox flow cell. Electrolyte 124 flows into half-cell 108 through inlet port 112 and out through outlet port 114, while electrolyte 126 flows into half-cell 110 through inlet port 116 and out of half-cell 110 through outlet port 118.

At least one electrode 102 and 104 in each half-cell 108 and 110 provides a surface on which the redox reaction takes place and from which charge is transferred. Suitable materials for preparing electrodes 102 and 104 generally include those known to persons of ordinary skill in the art. Redox flow cell 100 operates by changing the oxidation state of its constituents during charging or discharging. The two half-cells 108 and 110 are connected in series by the conductive electrolytes, one for anodic reaction and the other for cathodic reaction. In operation (e.g., during charge or discharge), electrolytes 126 and 124 are flowed through half-cells 108 and 110 through I/O ports 112, 114 and 116, 118 respectively as the redox reaction takes place.

Positive ions or negative ions pass through permeable membrane 106, which separates the two half-cells 108 and 110, as the redox flow cell 100 charges or discharges. Reactant electrolytes are flowed through half-cells 108 and 110, as necessary, in a controlled manner to supply electrical power or be charged by load/source 120. Suitable membrane materials for membrane 106 include, but are not limited to, materials that absorb moisture and expand when placed in an aqueous environment. In some embodiments, membrane 106 may comprise sheets of woven or non-woven plastic with active ion exchange materials such as resins or functionalities embedded either in a heterogeneous (such as co-extrusion) or homogeneous (such as radiation grafting) way. In some embodiments, membrane 106 may be a porous membrane having high voltaic efficiency Ev and high coulombic efficiency and may be designed to limit mass transfer through the membrane to a minimum while still facilitating ionic transfer. In some embodiments, membrane 106 may be made from a polyolefin material and may have a specified thickness and pore diameter. A manufacturer having the capability to manufacture these membranes, and other membranes consistent with embodiments disclosed, is Daramic Microporous Products, L.P., N. Community House Rd., Suite 35, Charlotte, N.C. 28277. In certain embodiments, membrane 106 may be a nonselective microporous plastic separator also manufactured by Daramic Microporous Products L.P. A flow cell formed from such a membrane is disclosed in U.S. Published Patent App. No. 2010/0003586, filed on Jul. 1, 2008, which is incorporated herein by reference in its entirety.

In some embodiments, multiple redox flow cells may be stacked to form a redox flow cell battery system. Construction of a flow cell stack battery system is described in U.S. patent application Ser. No. 12/577,134, entitled "Common Module Stack Component Design" filed on Oct. 9, 2009, which is incorporated herein by reference.

In some embodiments of redox flow cell 100 in FIG. 1, electrolyte 124 includes an aqueous acid solution. In some embodiments, the acidic solution includes aqueous hydrochloric acid. Electrolyte 124 further includes at least one metal salt (e.g., a metal chloride salt). In some embodiments, electrolyte 126 comprises an aqueous acid solution. In some embodiments, the acidic solution includes aqueous hydrochloric acid. Electrolyte 126 further includes at least one metal salt (e.g., a metal chloride salt).

In one embodiment, a redox flow cell battery system is based on a Cr/Fe redox pair. The remainder of the description will be based on a Cr/Fe redox flow cell battery, however, it should be understood that the concepts described herein may also be applied to other metals. In an embodiment of a Cr/Fe redox flow cell battery, both electrolytes 124 and 126 include a solution of FeCl2 and CrCl3 in aqueous HCl.

Figure 2:
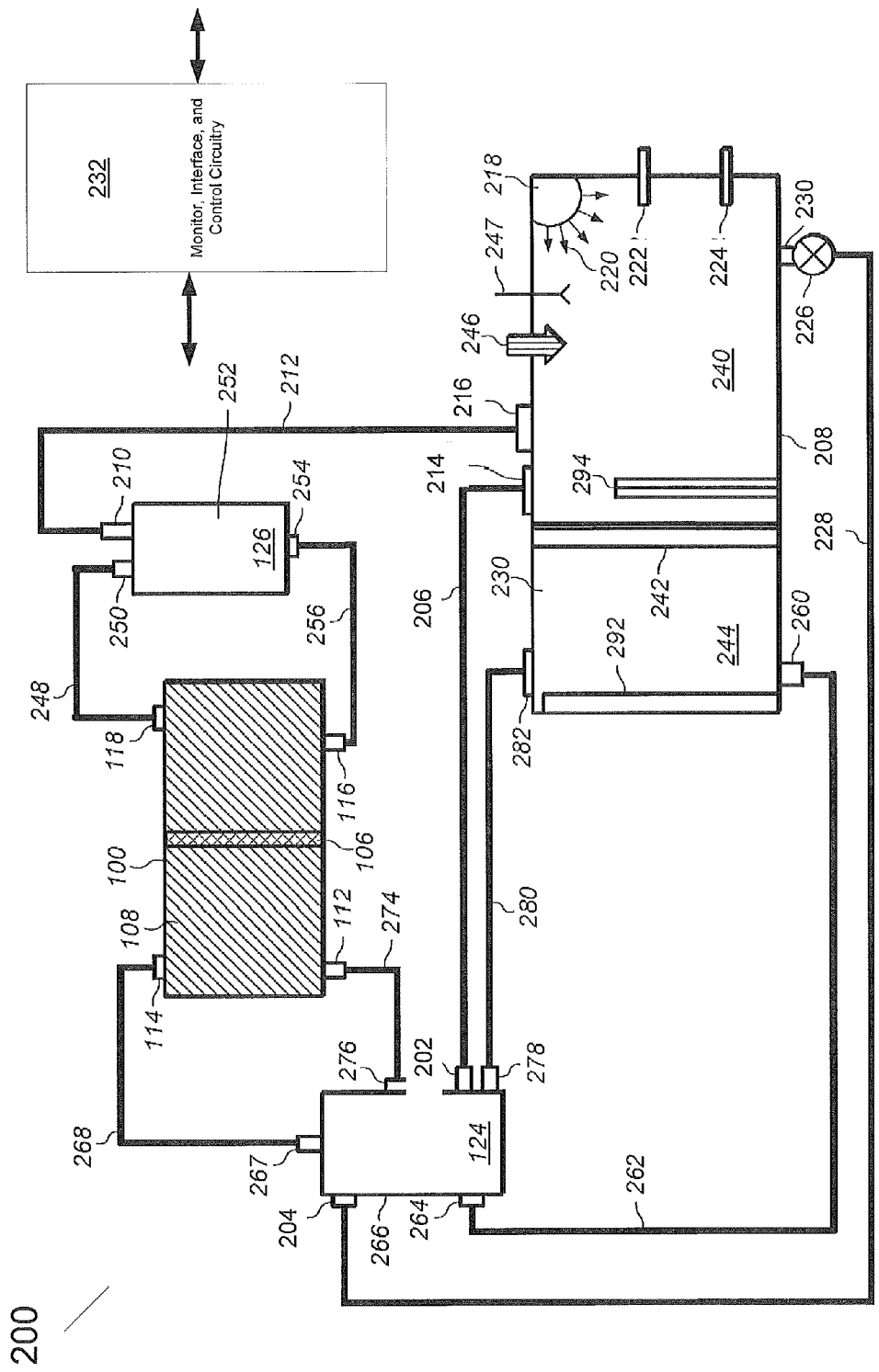
FIG. 2 is a simplified block diagram of a redox cell coupled to a rebalancing system consistent with some embodiments of the present invention.

FIG. 2 illustrates a redox flow cell battery system 200 that includes redox flow cell 100 coupled to rebalancing cell 208. For convenience only, redox flow cell 100 is illustrated with a single cell that includes half-cell compartment 108 and half-cell compartment 110 separated by membrane 106. $H_2$ produced in compartment 110 may be transferred from redox cell 100 through conduit 248 and into reservoir 252 through inlet 250, which also contains electrolyte 126. From there, $H_2$ may be vented from outlet 210 and carried along conduit 212 and into anode compartment 240 of rebalance cell 208 via inlet 216. Rebalance cell 208 also houses cathode compartment 244. Anode compartment 240 and cathode compartment 244 are separated by porous membrane 242. Cathode compartment 244 contains cathode 292, while anode compartment 240 contains anode 294.

When electrolyte in anode compartment 240 comprises aqueous HCl, the process of oxidation will effect the formation of Cl2 at anode 294, which then collects at the top of anode compartment 240. H2 introduced through inlet 216 also collects at the top of anode compartment 240. Anode compartment 240 includes ultraviolet source 218, which may be used to expose the H2 and Cl2 to ultraviolet radiation 220. Ultraviolet source 218 may be encapsulated by a shell to protect it from exposure to substances (e.g., Cl2 and H2) within anode compartment 240. The exposure of H2 and Cl2 to ultraviolet radiation 220 effects the formation of HCl, which then dissociates in the aqueous catholyte as H+ and Cl—. The heat and pressure resulting from the operation of ultraviolet source 218 may be closely monitored by sensors 246. H2 and Cl2 concentrations may be monitored through gas sensor 247.

Permeable membrane 242 may allow for the passage of $H^+$ into cathode compartment 244 and the aqueous electrolyte contained therein. This passage typically results in a drop in the electrolyte volume in anode compartment 240. The level of electrolyte in anode compartment 240 is controlled to be between lower sensor 224 and upper sensor 222. In some embodiments, a drop in electrolyte level detected by lower sensor 224 will stop the flow of power and effect the draining of electrolyte through outlet 230 and valve 226. From there, the electrolyte may be transported along conduit 228 and into reservoir 266 via inlet 204. Electrolyte may then be flowed from outlet 202 and along conduit 206 to refill anode compartment 240 via inlet 214. In some embodiments, valve 226 may remain open for some period of time after electrolyte begins to fill anode compartment 240 in order to flush compartment 240. Once anode compartment 240 is refilled, power is once again applied to electrodes 294 and 292 to begin production of chlorine gas.

In some embodiments, the refilling of anode compartment 240 may be accomplished by a second arm from conduit 274. For example, in some embodiments, redox flow cell battery system 200 may lack conduit 206. Thus, in some embodiments, a second arm off of conduit 274 (not shown) may be implemented to affect the transfer of electrolyte to anode compartment 240 via inlet 214 for refilling. In some embodiments, valve(s) may be implemented to control the fill.

Passage of $H^+$ into cathode compartment 244 will result in a rise in the level of the electrolyte and $H^+$ present therein. Restoration of the appropriate electrolyte level may be achieved by draining a volume of the electrolyte through conduit 262 via outlet 260. The electrolyte is transported along conduit 262 and into reservoir 266 via inlet 264. There, the electrolyte may be equilibrated and again dispelled via outlet 278. Equilibrated electrolyte from reservoir 266 may be used to replace the electrolyte drained from cathode compartment 244 through conduit 280 and inlet 282.

Alternatively, in some embodiments, electrolyte from cathode compartment 244 may be placed in fluid communication with reservoir 266 by other means. For example, in some embodiments, redox flow cell battery system 200 may lack conduit 262. Thus, in some embodiments, a second arm from conduit 274 may be implemented to affect the transfer of electrolyte from cathode compartment 244 to reservoir 266. In some embodiments, valve(s) may be implemented to control the transfer.

Electrolyte in half-cell compartment 108 of redox flow cell 100 may be drained through outlet 112 and replenished in reservoir 266 via conduit 274 and inlet 276. Replenished electrolyte 124 exits reservoir 266 though outlet 267, which is then transported through conduit 268 and reintroduced into half-cell compartment 108 via inlet 114. Similarly, reservoir 252 feeds electrolyte 126 from outlet 250 into half-cell compartment 110 via conduit 248 and inlet 118. Once depleted, the electrolyte may be drained from half-cell compartment 110 through outlet 116 and transported along conduit 256 for reintroduction into reservoir 252 via inlet 254.

Alternative I/O port and conduit placements will be obvious to persons of ordinary skill in the art. For example, in some embodiments, inlet 346 may be placed at the top of reservoir 266, instead of the side as depicted in FIG. 2. Other rearrangements to I/O port and conduit placements depicted in FIG. 2 are obvious and have the ability to effect similar results.

Further, flow-cell battery system 200 can include circuitry 232 that provides control, monitoring, and interface functions. Circuitry 232 may be coupled to various sensors, power switches, valves, and other components of system 200 to allow for monitoring and control of various functions of system 200. Such functions can include, for example, charging, discharging, and control of rebalance cell 208. Data obtained by circuitry 232 may be communicated out of system 200 and control commands may be communicated into system 200 through circuitry 232.

Descriptions of various details of redox flow cell battery systems can be found in the following U.S. Patent Applications, all of which are incorporated herein by reference in their entirety: U.S. patent application Ser. No. 11/674,101, entitled "Apparatus and Methods of Determination of State of Charge in a Redox Flow Battery", filed on Feb. 12, 2007; U.S. patent application Ser. No. 12/074,110, entitled "Battery Charger", filed on Feb. 28, 2008; U.S. patent application Ser. No. 12/217,059, entitled "Redox Flow Cell," filed on Jul. 1, 2008; U.S. patent application Ser. No. 12/576,235, entitled "Magnetic Current Collector" filed on Oct. 8, 2009; U.S. patent application Ser. No. 12/576,240, entitled "Venturi Pumping System in a Hydrogen Gas Circulation of a Flow Battery" filed on Oct. 8, 2009; U.S. patent application Ser. No. 12/576,242, entitled "Method and Apparatus for Determining State of Charge of a Battery" filed on Oct. 9, 2009; U.S. patent application Ser. No. 12/577,124, entitled "Flexible Multi-Walled Tubing Assembly" filed on Oct. 9, 2009; U.S. patent application Ser. No. 12/577,127, entitled "Thermal Control of a Flow Cell Battery" filed on Oct. 9, 2009; U.S. patent application Ser. No. 12/577,131, entitled "Methods for Bonding Porous Flexible Membranes Using Solvent" filed on Oct. 9, 2009; U.S. patent application Ser. No. 12/577,134, entitled "Common Module Stack Component Design" filed on Oct. 9, 2009; U.S. patent application Ser. No. 12/577,147, entitled "Level Sensor for Conductive Liquids" filed on Oct. 9, 2009; U.S. patent application Ser. No. 12/631,749, entitled "Methods for the Preparation and Purification of Electrolytes for Redox Flow Batteries" filed on Dec. 4, 2009; U.S. patent application Ser. No. 12/721,411, entitled "Methods for the Preparation of Electrolytes for Chromium-Iron Redox Flow Batteries" filed on Mar. 10, 2010; U.S. patent application Ser. No. 12/790,793 entitled "Control System for a Flow Cell Battery", filed May 28, 2010; U.S. patent application Ser. No. 12/790,595 entitled "Preparation of Redox Flow Battery Electrolytes from Raw Materials", filed May 28, 2010; U.S. patent application Ser. No. 12/790,601 entitled "Electrolyte Compositions", filed May 28, 2010; U.S. patent application Ser. No. 12/790,794 entitled "Hydrogen Chlorine Level Detector", filed May 28, 2010; U.S. patent application Ser. No. 12/790,749 entitled "Optical Leak Detection Sensor", filed May 28, 2010; U.S. patent application Ser. No. 12/790,783 entitled "Buck-Boost Control Circuit", filed May 28, 2010; U.S. patent application Ser. No. 12/790,753 entitled "Flow Cell Rebalancing", filed May 28, 2010; and U.S. patent application Ser. No. 12/790,613 entitled "Methods of Producing Hydrochloric Acid from Hydrogen Gas and Chlorine Gas", filed May 28, 2010.

Figure 3:
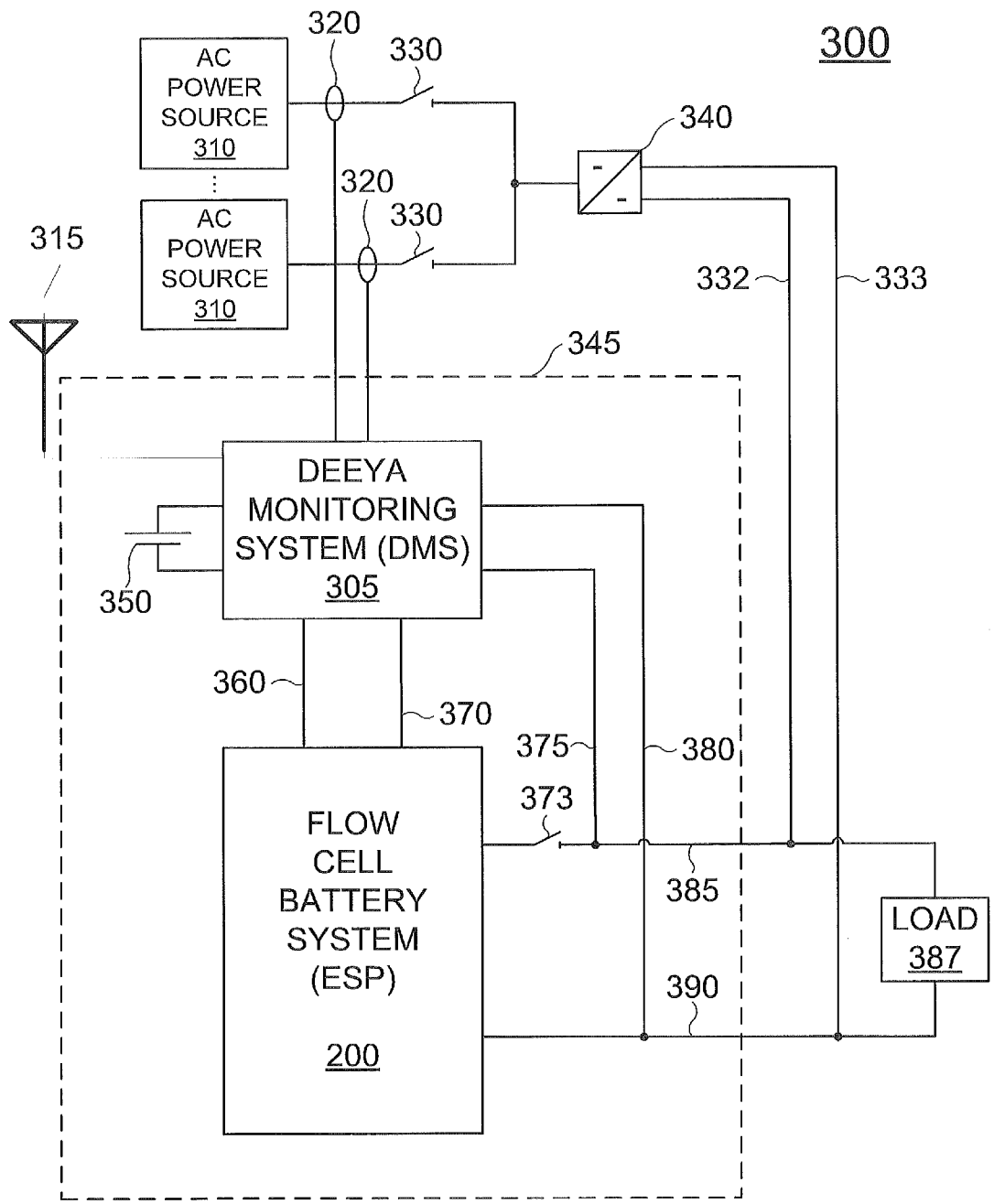
FIG. 3 illustrates different alternating current (AC) power sources charging the flow cell system consistent with some embodiments.

FIG. 3 illustrates a system 300 that includes a DMS 305 coupled with a flow cell battery (ESP) 200 according to some embodiments of the present invention. As shown in the example of FIG. 3, AC power system 300 can include one or more AC power sources 310, Deeya monitoring system (DMS) 305, and flow cell battery system (ESP) 200. In some embodiments, DMS 305 and ESP 200 can both be held within an enclosure 345. Power sources 310 can be outside of enclosure 345. As one of ordinary skill in the art can appreciate, one of DMS 305 and/or ESP 200 can also be outside of enclosure 345 and housed in one or more separate enclosures. In certain embodiments of the present invention, power sources 310 can be one or more diesel generators and high voltage transmission networks (or "power grid"). As one of ordinary skill in the art can appreciate, power sources 310 can be any power source, including biogas generators, natural gas generators, wind turbines, hydroelectric generators, fuel cells, photovoltaic cells and the like.

As shown in FIG. 3, AC power sources 310, of which there can be any number, can be coupled to rectifier 340. Rectifier 340 can be coupled to ESP bus 385 and REF 390 through electrical connections 332 and 333, respectively. Electrical load 387 can be coupled across ESP bus 385 and REF 390. As one or ordinary skill in the art can appreciate, different combinations of elements such as AC power sources, relays, rectifiers, battery terminals, and loads can be connected in AC Power System 300. Power is supplied to load 387 from AC power sources 310 through switches 330, respectively, one of switches 330 corresponding to one of power sources 310. Power from power sources 310 can also be supplied to ESP 200 to recharge ESP 200. Conversely, if no power is supplied by any of power sources 310, then power from ESP 200 can be applied to load 387. In some embodiments, a breaker 373 may be included in bus 385 to protect against high current to or from ESP 200.

DMS 305 is coupled to ESP 200, monitors the status of ESP 200, and communicates through interface 315 (shown here as a wireless antenna) with outside servers. DMS 305 can also be coupled to other devices which may be monitored. Devices can be outside of enclosure 345 and can be digital and/or analog. DMS 305 can send and receive analog signals (e.g., modem) and/or digital signals (e.g., over a bus such as RS-232, RS-485, CAN bus, and the like) to other devices. Further, as is illustrated in FIG. 3, DMS 305 can transmit and receive communications, for example through antenna 315.

In the particular example illustrated in FIG. 3, DMS 305 can measure voltages at ESP terminals, ESP bus 585 and REF 590, through electrical connections 375 and 380, respectively. Although ESP bus 385 can be at any voltage to be supplied to load 587, in some embodiments ESP voltage is 54 Volts. DMS 305 can also receive electrical power from ESP bus 385. Circuit breaker 373 can be coupled on ESP bus 385, for example, to prevent current above a predefined level from flowing to or from ESP 200. Circuit breaker 373 may be set, for example, from 1-2,000 Amps and, in some embodiments, is set at around 100 amps. DMS 305 can also receive electrical power from ESP 200 through bus 360. Bus 360 may supply DC voltage, for example a voltage between 1 and 50 volts (e.g. 5 V).

DMS 305 can send and receive data and instructions to and from ESP 200 through data communications 370. Data and instructions from ESP 200 can, for example, include state change information (e.g., from charge to discharge, discharge to charge, etc.), system information (e.g., system identifier, component info, etc.), system operation information (e.g., efficiency, ESR, etc.), DCS information (e.g., phone numbers, IP addresses, port numbers, user identification, passwords, etc.), Ebox information (e.g., serial numbers, firmware revision, etc.), and system parameters (e.g., pump capacity, stack type, etc.). In various embodiments of the present invention, data communications can be an RS-232 bus with transmit, receive, and ground lines. As one of ordinary skill in the can appreciate, data communications 370 can be any serial or parallel bus having data signals, control signals, clock signals, and the like.

Through connections 360 and 375, DMS 305 can receive power from ESP bus 385 or ESP 200, respectively. DMS 305 can select from which of ESP bus 385 or connection 360 to draw energy, for example, with a predefined priority (e.g., first connection 360 and second ESP bus 385). When ESP bus 385 or connection 360 are not available to supply energy, DMS 305 can draw power from a back-up energy source 350. Back-up energy source 350 can be any energy storage medium, for example an electrochemical cell such as a zinc-carbon, alkaline, nickel cadmium, nickel metal hydride, or lithium-ion battery. In some embodiments of the present invention, back-up energy source 350 can be a 3.7 V lithium-ion battery.

As is further shown in FIG. 3, DMS 305 can monitor AC power sources 310 through sensors 320, respectively. In some embodiments of the present invention, sensors 320 are current sensors. DMS 305 can, for example, switch the state of ESP 200 from charging to discharging when none of power sources 310 are available. DMS 305 can, accordingly, monitor both charging and discharging states of ESP 200 through data communications 370.

Figure 4:
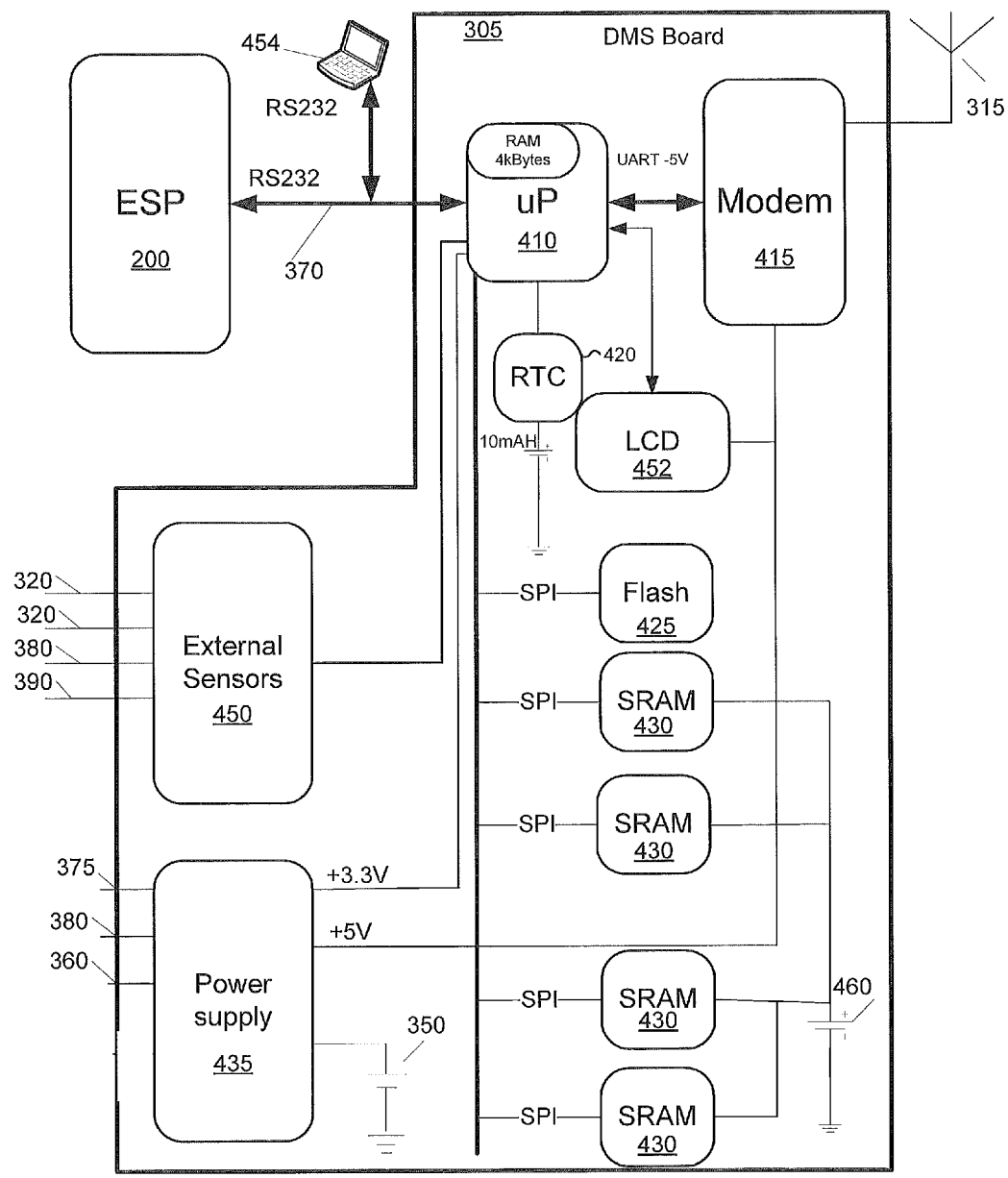
FIG. 4 is a simplified block diagram illustrating a Deeya monitoring system (DMS) according to some embodiments of the present invention

FIG. 4 illustrates a DMS 305 according to some embodiments of the present invention. As shown in FIG. 4, DMS 305 can include a controller 410, communications 415, and memory. Communications 415 provides physical access to a communications network and can for example be a network interface card (NIC) for interaction with a wired network and/or modulator-demodulator (modem) that, for example, interacts with a wireless network. In some embodiments of the present invention, communications 415 can be a cellular modem which modulates an analog carrier signal to encode digital information over a mobile telephone communications network (GPRS, UMTS, HSPA, EVDO, WiMax, etc.). In some embodiments, communications 415 can be a Landcell™ GPRS modem. As shown in the example of FIG. 4, communications 415 can be coupled to remote antenna 315 for communications with through a wireless network. Alternatively, communications 415 can be coupled to a wired network.

Controller 410 can be any controller or group of controllers that communicate with communications 415, with ESP 200, and receive further inputs from external sensors 450. As shown in FIG. 4, for example, controller 410 can have internal memory, is digitally coupled with ESP 200 through control circuitry 232, and receives external sensor inputs through external sensor circuit 450. An example of a controller that can be utilized as controller 410 is the Silicon Laboratories C8051F340 USB Flash microcontroller (MCU). The Silicon Laboratories MCU provides for analog inputs, an RS232 bus that can be utilized to communicate with ESP 200, a Universal Asynchronous Receiver/Transmitter (UART) that can be utilized to couple with modem 415, a 10-bit analog to digital converter that can receive analog signals from external sensor receiver 450, and a Serial Peripheral Interface (SPI) that can be utilized to couple with peripherals such as memory 425 and 430. As shown in FIG. 4, controller 410 is coupled through the SPI bus to one or more nonvolatile (Flash) memories 425 and one or more volatile (SRAM) memories 430. As shown in FIG. 4, an RS232 connection can be provided so that an external processor 454 can be coupled to ESP 200 and DMS 305. Processor 454 may be any computing device, such as a notebook computer or PDA.

Controller 410 can receive timing from a real-time clock (RTC) 420. RTC 420 can be, for example, Seiko Instruments S35390A, which communicates with controller 210 through an I2C interface. Controller 410 can further be coupled to an LCD display 452 for display of certain messages, including error messages, to a user that is servicing or inspecting ESP 200. LCD display 452 can, for example, be a Crystalfontz CFAH2004K-TMi LCD display.

As shown in FIG. 4, external sensors 450 receives signals from current sensors 320, connection 375 to ESP bus 385, and connection 380 to REF 390. Other external sensors may also be utilized. Other sensors may include, for example, detectors appropriate to measure external environmental conditions (e.g., temperature and humidity), emissions, or other condition. External sensors 450 can include filters, analog buffers, or other electronics that prepare analog signals for input to controller 410.

Non-volatile memory 425 can store the state of the system formed by DMS 305 and ESP 200 at a particular point in time, including data collected from ESP 200 and external sensors 450. Memory 425 can be utilized to store data for any length of time, for example between 1 minute and 24 hour's worth of data. In some embodiments of the present invention, storage of 50 minutes of operating data for ESP 200 can be utilized. Non-volatile memory 425 can thus preserve data from a time period at or around the time of a system problem (e.g., failure). That data can be used to diagnose the system problem, but may be lost if stored in volatile memory 430 after losing primary and backup power sources, or if it is overwritten. Non-volatile memory 425 can be partitioned and certain types or classes or data stored in each partition. For example, a portion of non-volatile memory 425 can store warning and/or error messages. During operation, data may be first written into volatile memory 430 and transferred periodically to non-volatile memory 425. Further, with battery back-ups, data may be transferred from volatile memory 430 to non-volatile memory 425 upon failure of the system.

Power to DMS 305 can be provided by power supply 435. As shown in FIG. 4, power supply 435 is coupled through connections 375 and 380 to ESP bus 385 and REF 390, respectively, as well as connection 360 to ESP 200. Further, power supply 435 may receive power from a back-up supply 350. In some embodiments, back-up supply 350 may be a 3.7 V Li-Ion 900 mAH battery, which may provide about 30 minutes of back-up power in some cases. Further, volatile memory 430 may be provided with a back-up power supply 460. Back-up power supply 460 may be a 10 mAH 3V battery, which may provide about a 100 day backup.

FIG. 5 illustrates a communications system 500 according to some embodiments of the present invention. As shown in FIG. 5, one or more Deeya monitoring systems (DMS) 305 communicate through one or more remote antennas 315, although DMS 305 can be networked in any other fashion. As those of ordinary skill in the art can appreciate, DMS 305 can monitor any system which would benefit from remote monitoring and control (e.g., lead acid batteries, diesel generators, cell phone tower electronics, and the like). For example, as shown in FIG. 4, DMS 305 can be utilized to monitor flow-cell battery system 200 by communications through circuitry 232. DMS 305 can include a modulator-demodulator (modem) which modulates an analog carrier signal to encode digital information sent from DMS 305, and demodulate signals received by remote antenna 315. In some embodiments, digital information sent from DMS 305 can be encrypted. Information can be transmitted by remote antenna(s) 315, which can, for example, be a dipole antenna, quad antenna, and the like.

Remote antenna 315 communicates through communications link 510, which can, for example, be a radio frequency signal (i.e., 30 kHz to 300 GHz) carrying digital or analog signals. Communications link 510 may be coupled through a number of intermediate antennae 525, satellites 520, and/or networks 522 before arriving at local antenna 530. In some embodiments of the present invention, remote antenna 315, intermediate antenna 525, network 522, satellite 520, and local antenna 530 can be components of a GSM cellular radio network and communications link 510 can be GSM radio signal. In various embodiments, communications link 510 can originate from remote antenna 315, be received by one or more intermediate antennas 525, and be retransmitted to local antenna 530; communications link 510 can originate from remote antenna 315, be relayed through satellite 520, and be received by local antenna 530; and communications link 510 can originate from remote antenna 315 and be received by local antenna 530 directly. In some embodiments, signals originate from local antenna 530 and are received at remote antenna 315. Intermediate antenna 525 or satellite 520 may or may not be in the path of communications link 510. As one of ordinary skill in the art can appreciate, different combinations of remote antenna 315, satellite 520, intermediate antenna 525, and local antenna 530 are possible.

Local antenna 530 can be coupled to infrastructure 535. Infrastructure 535 can include a modem which can demodulate signals received and modulate information to be sent. Infrastructure 535 can include a network, for example an Ethernet network comprised of transmission lines (e.g., Category 6 cable, twisted pair wire, coaxial cable, fiber optic cable, and the like), hubs, switches, routers, servers, and workstations. Infrastructure 535 can be coupled to one or more servers 540. Servers 540 may further be coupled to database 560 and to workstation 545. In some systems 500, there may be multiple servers 540 in various geographic locations and handling particular communications protocol (e.g., GPRS, SMS, or other protocol). In some embodiments, DMS 305 may communicate with more than one server 540.

Although FIG. 5 depicts communication system 500 as a wireless system, for example a GMS cell system, DMS 305 may communicate with infrastructure 335 through any network, wired or wireless. For example, communication 510 may be transmitted through a ground based wired system, through direct satellite uplinks, through the internet, or through any combination of different transmission media.

Figure 6A:
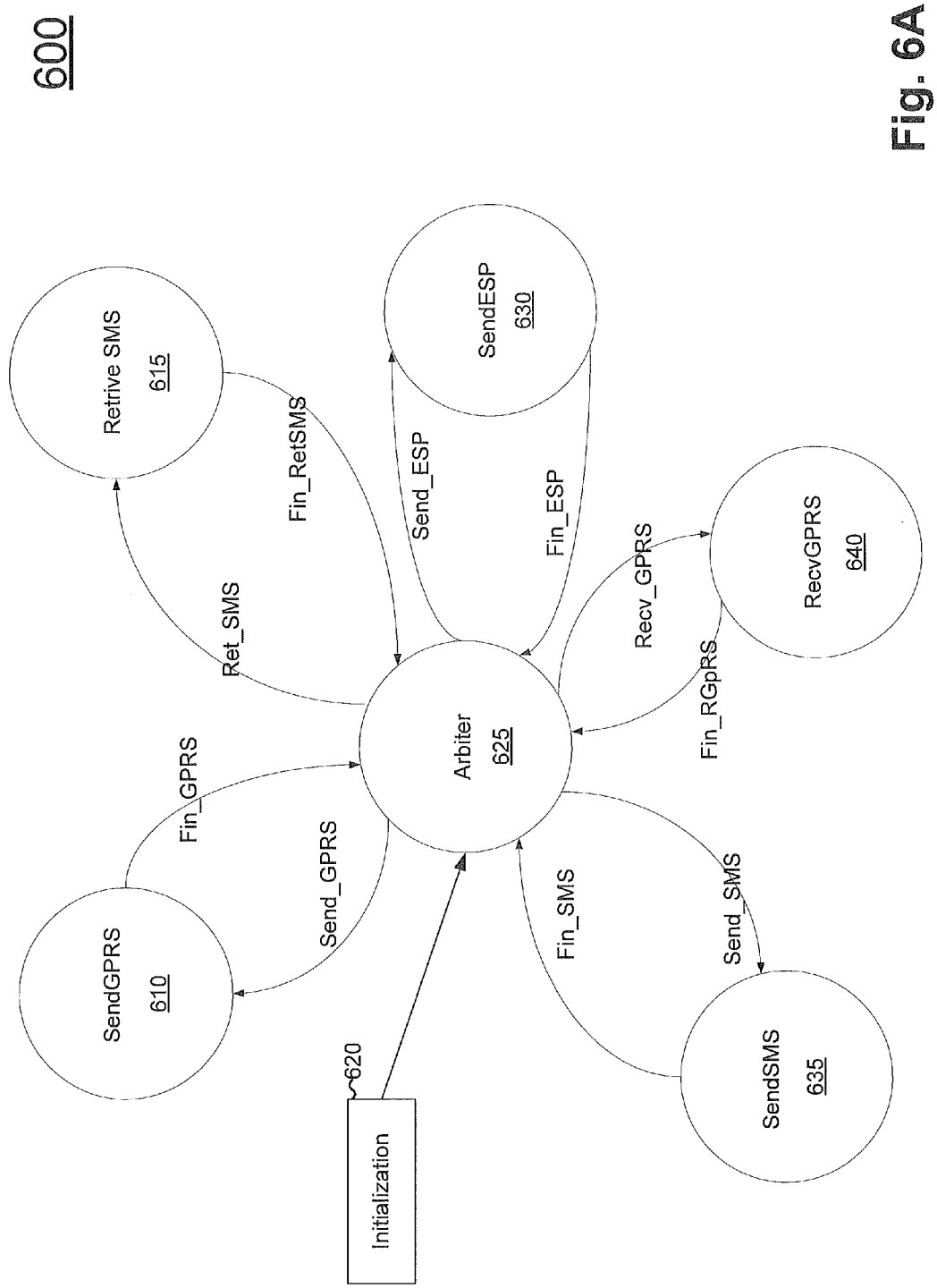
FIG. 6A is a simplified state diagram for operating a DMS according to some embodiments.

FIG. 6A, illustrates state machine 600 executed by controller 410 for directing communications to and from DMS 305 through modem 415. As discussed above, DMS 305 also monitors and retrieves data regarding the operation of ESP 200 and data from sensors attached to external sensors 450. FIG. 6A illustrates a state machine 600 for the communications function of DMS 305, although DMS 305 also performs other functions. As shown in FIG. 6A, in some embodiments DMS 305 can utilize a short message service (SMS) component of a phone, internet, or mobile communications services to send or receive messages, or DMS 305 can utilize a general packet radio service (GPRS) currently available on 2G and 3G cellular communications systems of the global system for mobile communications (GMS).

When DMS 305 starts up (e.g., after power is cycled or reset is performed), DMS 305 begins in Initialization state 620 and transitions to Arbiter state 625 when initialization is complete. In Initialization state 620, DMS 305 can initialize hardware (e.g., reset registers, provide inputs, and receive outputs) of devices internal and external to enclosure 345. Arbiter 625 determines the type of messaging service to utilize in communications and, when messages are to be sent or received, transitions to the appropriate one of Send GPRS state 610, Retrieve SMS state 615, Receive GPRS state 640, or Send SMS state 635. If data or instructions are to be sent to ESP 200, then arbiter 625 can transition to send ESP state 630.

Figure 6B:
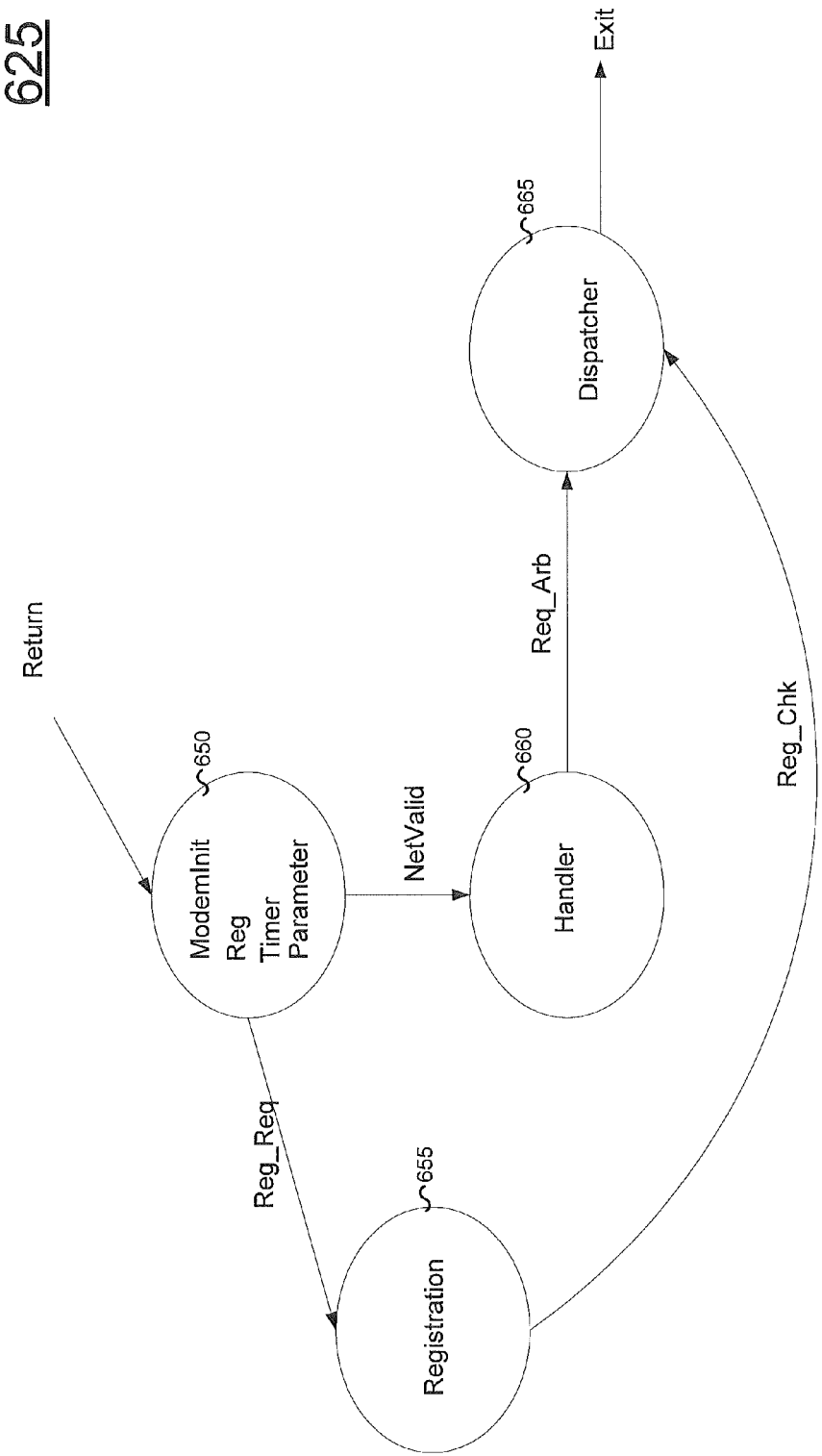
FIG. 6B is a state diagram illustrating the arbiter state of FIG. 6A.

FIG. 6B illustrates an example embodiment of arbiter state 625. Arbiter state 625 begins in ModemInit state 650. In ModemInit state 650, DMS 305 can determine whether communications information is stored in DMS 305 or a dongle and/or a controller included in control circuitry 232 of ESP 200. A dongle is illustrated in "System Dongle," U.S. patent application Ser. No. 12/855,059 filed Aug. 12, 2010, which is hereby incorporated by reference in its entirety. A controller for a flow cell battery system is illustrated in "Control System for a Flow Cell Battery," U.S. patent application Ser. No. 12/790,793 filed on May 28, 2010, which is hereby incorporated by reference in its entirety. Communications information can be used to identify ESP 200 and to enable communication between ESP 200 and one or more servers 540. For example, communications information can be one ESP 200 serial numbers (or other identification), and contact information (e.g., IP address, port number, access point name (APN), telephone number, username, password, etc.), and the like for one or more servers 540.

In ModemInit state 650, DMS 305 can initialize communications 415 by performing a reset of communications 415 and waiting a predetermined amount of time (e.g., 10 seconds to five minutes) for communications 615 to connect to one or more communications networks. In various embodiments of the present invention, a predetermined amount of time can be, for example, 15 seconds. DMS 305 can initialize communications 415 by setting or loading service parameters into communications 415. In some embodiments of the present invention, in ModemInit state 650 DMS 305 can: configure short message service (SMS) by setting up notification for incoming text messages, turning off delivery report request after sending an SMS message, setting up the SMS send mode, and identifying an SMS storage location; check for a subscriber identity module (SIM) card and optionally remain in ModemInit state 650 until a SIM card is detected; configure GPRS service by setting an access point name (APN), user name and password and connecting to a GPRS network; check for one or more additional sets of communications information (e.g., IP addresses, Domain names and port numbers of alternative servers) to use in the event a set of communications information is inoperative; and check a flag (one or more bits which store a binary value or code that has an assigned meaning) in an appropriate register that indicates DMS 305 is registered. When DMS 305 is not registered, DMS 305 transitions to Registration state 655. When DMS 305 is registered, DMS 305 transitions to Handler state 660. In the Modeminit state Modem 415 either connects to the GPRS network or the SMS network. An error is generated if connection to the network is not established.

In Registration state 655, DMS 305 registers with a predefined number of servers 540. Servers 540 can be data servers, SMS servers, and the like. In some embodiments of the present invention, DMS 305 registers with two data servers and two SMS servers for a total of four servers 540. For example, registration can include indentifying the system with a system identifier to a data server or SMS server. The system identifier may be stored in ESP 200. In various embodiments of the present invention, during the registration process DMS 305 can send its Subscriber Identity Module (SIM) card number to an SMS server. After receiving acknowledgement from each of servers 540, DMS 305 transitions to Dispatcher state 665.

In Handler state 660, DMS 305 schedules transmissions and handles errors. DMS 305 can generate a state buffer that contains state transition information. DMS 305 can send messages via GPRS and SMS following a set of rules, for example, a predefined sequence or a scheduling algorithm (e.g., round robin). In certain embodiments of the present invention, DMS 305 can default to sending messages in a particular way, for example via GPRS.

Once a transmission is scheduled, DMS 305 can check whether a flag in a register is set indicating that the message was successfully transmitted. If not, DMS 305 can schedule the message again a predetermined number of times (e.g., 1-512 times) if the message was not successfully transmitted after a predetermined amount of time (e.g., 1 sec-72 hours). DMS 305 can also subsequently send the message to one or more other servers 540, use a different communications protocol, and/or utilize a different communications network. For example, if a connection to one of server 540 fails, then DMS 305 can initiate connection to another of server 540 using additional sets of communications information. When the number of attempts to connect to a server 540 exceed a predetermined number (e.g., 1-512 attempts), DMS 305 can set a flag to suspend further retry attempts and/or a flag to communicate using an alternative protocol, over an alternative network, and/or to an alternative one of server 540. In various embodiments of the present invention, the predetermined number of retry attempts can be 3. In certain embodiments of the present invention, DMS 305 can switch from one server 540 to another and/or from sending messages over one protocol to another protocol, for example from GPRS to SMS.

When DMS 305 cannot communicate using any of its supported protocols, over any of its available networks, and/or to any of its known servers 340, DMS 305 can suspend communications for a predetermined period of time (e.g., 1 minute-24 hours) before attempting communications again. In certain embodiments of the present invention, the predetermined period of time can be 30 minutes, after which connection to one or more of server 540 will be attempted again.

DMS 305 can analyze the frequency of communications with ESP 200 in handler 660. For example, if ESP 200 does not transmit a message to DMS 305 at a minimum predefined frequency (e.g., 5 seconds-48 hours), then DMS 305 will issue an alarm (e.g., indicator light on a panel, sound from a buzzer, message on a display, and the like). In some embodiments of the present invention, ESP 200 transmits data in a set period of time, for example every 12 seconds.

DMS 305 can monitor communications from ESP 200. When partial data is received from ESP 200 or no data at all is received from ESP 200 for a predetermined amount of time (e.g., 5 seconds-48 hours), DMS 305 can issue an alarm (e.g., indicator light on a panel, sound from a buzzer, message on a display, and the like) and/or send a message to a server. DMS 305 can monitor, record, display, and send ESP 200 status information. For example, DMS 305 can monitor and record power levels and the status of components (e.g., pumps, sensors, etc.), and send such recorded information to a server 540. After Handler state 660, DMS 305 transitions to Dispatcher state 665.

In Dispatcher state 665, DMS 305 can accumulate messages in a state buffer, disable writes to a state buffer, make sure each state is executed in order (e.g., first-in-first out (FIFO) and last-in-first-out (LIFO)), clear the state buffer, and enable writes to the state buffer. In various embodiments of the present invention, DMS 305 clears the state buffer and enables writes to the state buffer after the states are executed.

DMS 305 can receive and add a time stamp to data from ESP 200 in a free running task which runs on a scheduled basis. DMS 305 can receive data through data communications 370 and use a time stamp from ESP 200 or controller 410 coupled to ESP 200. DMS 305 can buffer data received in state buffer, for example, using memory 530. As discussed before, memory 530 can be implemented using one or more semiconductor die, packaged integrated circuits, multi-chip module, chip stack and the like. Memory 530 can include, for example, one or more read and/or write ports and logic so that data is written to and read from the memory in a certain order (e.g., FIFO or LIFO). In various embodiments of the present invention, memory is a static RAM (SRAM) with a Serial Peripheral Interface Bus (SPI) and a battery backup.

DMS 305 can determine how data from ESP 200 is transmitted in state SendGPRS/SendSMS. From Dispatcher state 665, DMS 305 can transition to SendGPRS state 610 when DMS 305 determined a message is to be sent to a GPRS server during Handler state 660. From Dispatcher state 665, DMS 305 can transition to RetrieveSMS state 615 when DMS 305 determined a message is to be received from an SMS server 540. From Dispatcher state 665, DMS 305 can transition to SendESP state 630 when DMS 305 determined a message is to be sent to ESP 200. From Dispatcher state 665, DMS 305 can transition to SendSMS state 635 when DMS 305 determined a message is to be sent to an SMS server 540. From Dispatcher state 665, DMS 305 can transition to RetrieveGPRS state 640 when DMS 305 determined a message is to be received from a GPRS server 540.

During Registration State 655, DMS 305 determines all GPRS servers and SMSservers where it needs to register and builds a State buffer. Based on the State buffer Dispatcher 665 transitions to various states as shown in FIG. 6A. Registration happens when DMS 305 initially starts up. During this time, DMS 305 indentifies itself with the GPRS servers and SMS servers and receives acknowledgement. This enables the Servers to know that a new System has come on line and also lets DMS 305 know that it can send data to these Servers.

The registration with the Servers that occurs in registration 655 occurs initially when DMS 305 is started the System info is sent to the servers. The servers in turn acknowledge after validating the DMS 305. During registration, the Servers validates the new System and also DMS 305 becomes aware of all the Servers that are available to receive the data.

DMS 305 can also filter the data, prioritize the data (e.g., based upon a transmission time requirement), and queue data in the buffer such that the higher priority data is sent sooner than lower priority data in Handler 660. As one of ordinary skill in the art can appreciate, the data can be encoded using any format, for example, American Standard Code for Information Interchange (ASCII), Extended Binary Coded Decimal Interchange Code (EBCDIC), Binary Coded Decimal (BCD), and the like. In some embodiments of the present invention, arbiter state 625 can lower power consumption of DMS 305 (e.g., because modem 415 is idle when not in use).

In SendGPRS state 610, data can be transferred from DMS 305 to one or more GPRS servers 540. In SendGPRS state 610, DMS 305 can format data received from ESP 200 for transmission over GPRS (e.g., AT command set). DMS 305 can apply error correction techniques to the data (e.g., repetition codes, parity bits, checksums, Cyclic Redundancy Checks (CRCs), hash functions, error correcting codes, and the like). In some embodiments of the present invention, DMS 305 can apply an error detecting and/or correcting scheme (e.g., cyclic redundancy check (CRC)) to data sent to ESP 200; lock the GPRS send buffer; transmit data using the GPRS modem; wait a predefined period time for acknowledgement; filter incoming messages; and release the GPRS send buffer. DMS 305 can also send the data to a GPRS modem in communication 510, issue an error or time out (after a predetermined amount of time) if all of the data was not successfully sent, set a flag if all of the data was sent successfully, and return to Arbiter state 625.

In SendSMS state 635, data can be transferred from DMS 305 to one or more SMS servers 540. In certain embodiments of the present invention, SMS messages can be sent when transmission via GPRS fails; when an emergency situation is encountered (e.g., data from ESP 200 is not received by DMS 305 for an extended period of time, for example over 45 seconds); and when sending registration information to identify ESP 200 and DMS 305 to one or more servers 540.

DMS 305 can format data received from ESP 200 through communications 370. DMS 305 can send formatted ESP data as an SMS message. DMS 305 can issue a time out after a predefined about of time, if transmission is unsuccessful. In certain embodiments of the present invention, time out is about 3 seconds. DMS 305 can create a log of all transmissions attempted and their status (e.g., transmission is pending, failed, or successful).

In RetrieveSMS state 615, data can be transferred from one or more SMS servers 540 to DMS 305. DMS 305 can process a message from one or more SMS servers by retrieving a message from one or more SMS servers; confirming that the retrieved message is from a valid SMS server; ignoring messages which are not from a valid SMS server; using time information in the message for time synchronization; determining the destination for the message (e.g., ESP 595 and/or DMS 305), and clearing a processed message in modem 415. In various embodiments of the present invention, time synchronization can occur when DMS 305 sends a request for present time to one or more SMS servers and updates a real-time clock in DMS 305 to time received from SMS servers when time is received within a predetermined amount of time (e.g., 2-5 minutes).

In RetrieveGPRS state 640, data can be transferred from one or more GPRS servers 540 to modem 415. DMS 305 can process a message from one or more GPRS servers 540 by retrieving a message from one or more GPRS servers 540; confirming that the retrieved message is from a valid GPRS server 540; ignoring messages which are not from a valid GPRS server 540; determining the destination for the message (e.g., ESP 200 and/or DMS 305), and clearing a processed message in modem 415.

In SendESP state 630, DMS 305 can send data to ESP 200. In certain embodiments of the present invention, data sent by DMS 305 to ESP 200 can include time acknowledgments with a time stamp to ESP 200. Time acknowledgements can be contained within timing information. Timing information can be used to record time corresponding to events (e.g., change in Ebox information) in dongle. DMS 305 can also convert data received from SMS and/or GPRS formats to a format suitable for ESP 200. The System parameter changes (ESR, calibration curves, or other parameters), System operating parameters (e.g., Pump speeds) and certain commands (e.g., to control Electrolyzer ON or other controls) is also sent in Send ESP State 630.

As discussed above, DMS board 305 receives data from ESP 200 and then, as illustrated in the state functions shown in FIGS. 6A and 6B, to decide and send it to a Server through different network systems (like GPRS, GSM, . . . ). For whatever reason if the connection to all the networks fails, then the data is stored in internal memory (Flash 425 or SRAM 430). Once the network connection is resumed, then DSM 305 starts sending the data out. In this way data loss can be avoided.

The acknowledgement between the ESP 200 and DMS 305 can happen through time ack. The timeack has the time embedded into it. The embedded time is used by ESP 200 for timestamping various events, for example like EBox changes or other events.

As shown in FIG. 4, DMS 305 can be powered by ESP 200 or by the external bus 385 or by the internal battery 350. Since the power to DMS 305 is independent, DMS 305 can monitor ESP bus 385, monitor other peripherals that are connected external to ESP 200, and monitor ESP 200 itself.

Figure 7:
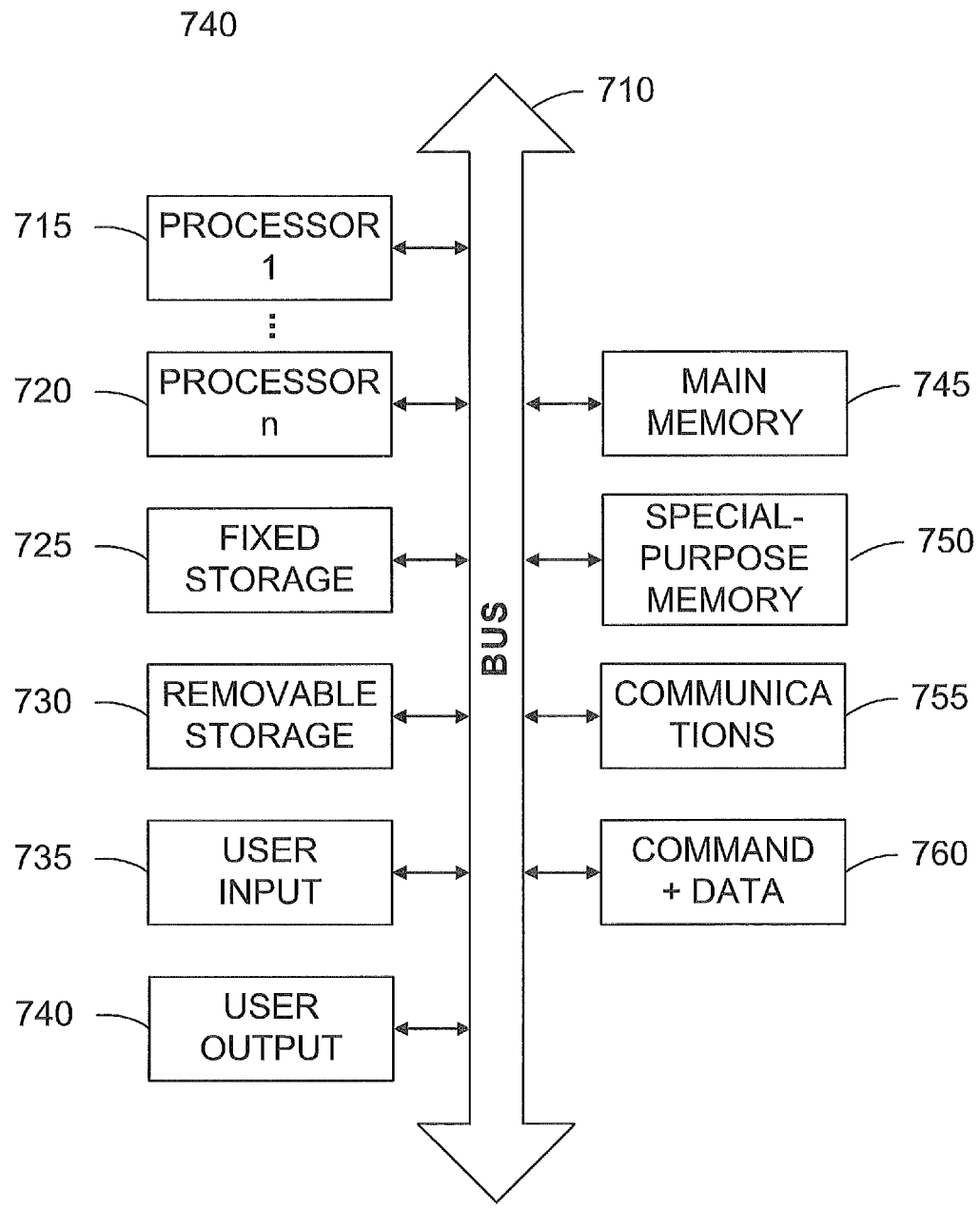
FIG. 7 illustrates a server according to some embodiments of the present invention.

FIG. 7 illustrates a simplified block diagram of an example of server 540. Server 740 can include one or more processors 715 and 720, which can be any combination of microcontrollers, microprocessors, digital signal processors, etc. (e.g., Microchip PIC, ARM, Intel x86, Power ISA, Texas Instruments OMAP, etc.). Server 540 can include a fixed storage 725, which can be a magnetic hard disk, solid state hard disk, and other non-removable storage. Server 540 may also include removable storage 730, which can be tape, floppy disk, USB flash drive, CD-ROM, DVD, Blu-ray Disc, or any other removable media.

A user input 735, which can be keyboards, keypads, mice, touch pads, digitizing tablets, trackballs, game controllers (e.g., joystick, game pad, steering wheel, pedals, yoke, dance pad, or other input device), fingerprint reader, barcode scanner, and other user input device, may also be included in server 540. Server 540 can also provide user output 740, which can be a display screen or monitor, indicator lights, speaker, headphones, or other display devices. User output 740 can include graphics processing units, sounds chips, etc.

Server 740 may also include main memory 745, which can be volatile static and/or dynamic random-access memory (e.g., SRAM, FPM, EDO, Synchronous SDRAM, DDR SDRAM, DDR2 SDRAM, DDR3 SDRAM, etc.), nonvolatile memory (e.g., EPROM, EEPROM, Flash, etc.), and based upon technologies such as silicon chip and carbon nanotubes. Server 740 may include special purpose memory 750, which can be of a technology similar to main memory and can be used for caches, shadow memory, graphics, etc. (e.g., GDDR).

Server 740 may further include communications 755, which can be any of wired or wireless communications between computers or devices, such as Ethernet, wireless LAN, terrestrial microwave, communications satellites, cellular and PCS systems, and smart grid. In some embodiments of the present invention, communications 755 includes an Ethernet network.

Command code and operating data may be held in command and data 760, which may be a memory system and may be non-volatile memory. In some embodiments, command and data 760 may be included in main memory 745.

Processors 715 and 720, fixed storage 725, removable storage 730, user input 735, user output 740, main memory 745, special purpose memory 750, communications 755, and command and data 760 can communicate through bus 710. Bus 710 can be any communications bus utilized to transmit data between devices.

Referring back to FIG. 5, server 540 is coupled to database 560. Database 560 can store information received from one or more DMS 305. The stored information can be retrieved by server 540. One or more of server 540 can access database 560 and disseminate (e.g., as reports and real-time displays) information in an automated manner or as requested. In some embodiments, a real-time display of DMS 305 data can be displayed on workstation 545. In some embodiments, workstation 545 can query database 560 through server 540 for information regarding or sent by DMS 305. In some embodiments, workstation 545 can receive reports of redox flow battery information from server 340. In certain embodiments of the present invention, workstation 545 can send commands to DMS 305 through server 540, infrastructure 535, local antenna 530, optionally satellite 520 and/or intermediate antenna 525, and remote antenna 515.

A mobile device 555 can also connect to server 540. Mobile device 555 can, for example, be a notebook computer, laptop computer, rugged (or ruggedized) laptop, ultraportable computer, netbook computer, tablet computer, mobile telephone, smartphone, personal digital assistant (PDA), and the like. Mobile device 555 can include input and output devices (e.g., LCD display, keyboard, mouse, touchpad, or other such device) to interface with a user, nonvolatile memory (e.g., FLASH memory, EEPROM, MRAM, hard disk drive, optical disc, or other such device), and transceiver to communicate with server 540 through second communications link 550, local antenna 530, and infrastructure 535. Second communications link 550 can be at least one of a physical connection (e.g., Category 6 cable, twisted pair wire, coaxial cable, fiber optic cable, and the like), radio waves, and infrared signals (e.g., terrestrial microwave, communications satellites, cellular and PCS systems, wireless local area networks (WLANs), and the like).

As discussed above, DSM 305 can communicate with a number of different servers 540 and data can be exchanged with each of the servers 540. Additionally, the servers 540 themselves can communicate with each other and share data. In some embodiments, data with respect to each of the DSM 305 (and consequently a corresponding number of ESP 200) can be compiled in a particular central database.

Figure 8A:
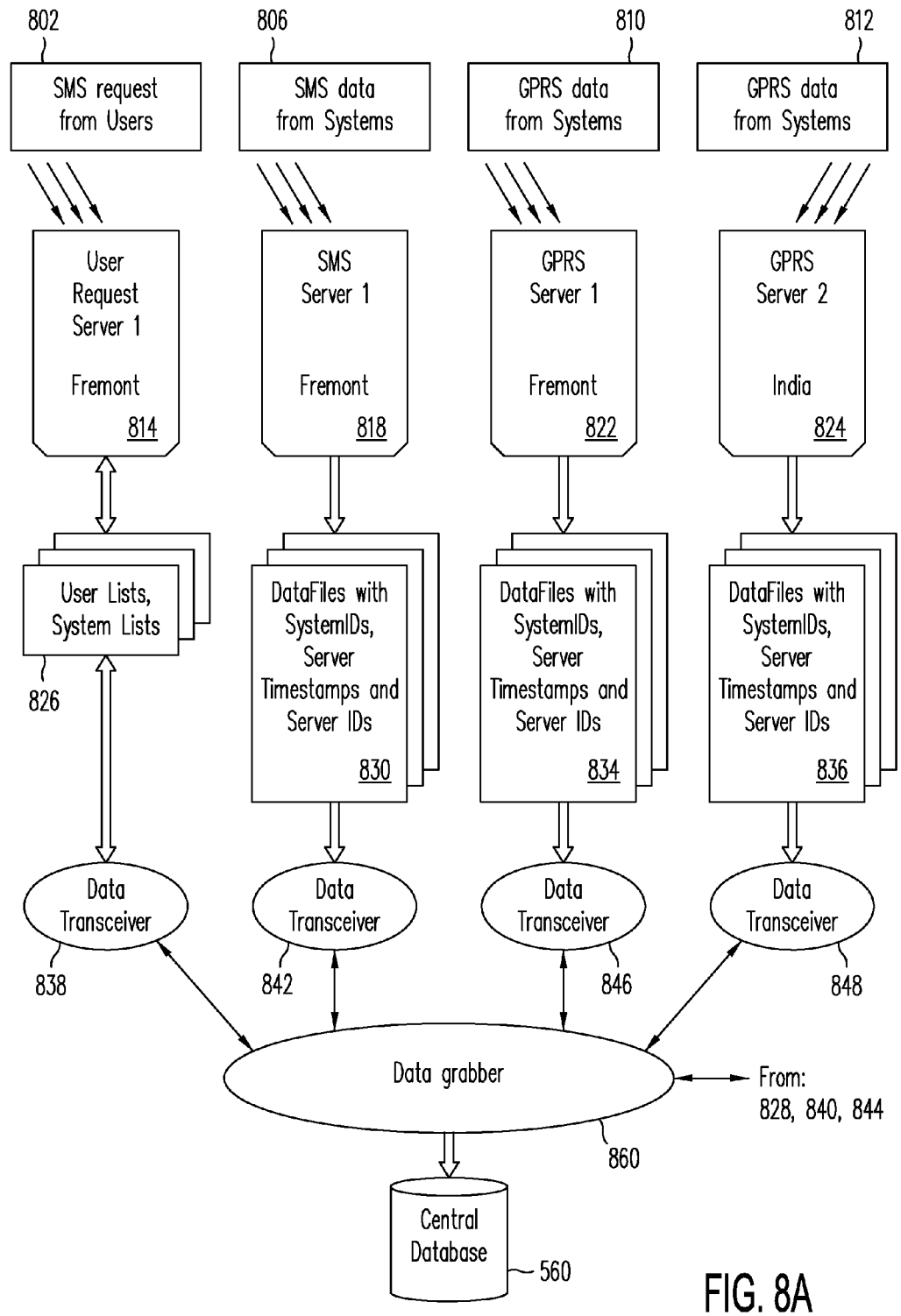
FIG. 8 is a simplified block diagram for a server architecture consistent with some embodiments of the present invention.

FIG. 8 illustrates an example of DCS server architecture 800 for storing information throughout the life of one or more of ESP 200. Information can be received from and sent to numerous sources. For example, data 802-812 can be received from or sent to one or more GPRS servers 822-824, SMS servers 818-820, and/or user request servers 814-816. In certain embodiments of the present invention, user request server 814-816 receives (but does not send) data from database 560.

GPRS servers 822-824 can send and receive GPRS data 810-812 that has been received through network 500 through a communications network (e.g., Ethernet) that is ultimately coupled to central database 560. GPRS servers 822-824 can service multiple active GPRS connections 500 simultaneously, for example, using a multi-threaded architecture. GPRS servers 822-824 can also have one or more levels of buffering, for example, to buffer simultaneous incoming connection requests.

FIG. 9 illustrates an example GPRS server architecture 900 performed on one or more GPRS servers 822-824. GPRS server architecture 900 can include a GPRS listener thread 915 which can detect and accept incoming connections from incoming connection queue 910 in step 920 and queue incoming connections in a secondary buffer, service queue 930, in step 925. GPRS server architecture 900 can also have one or more GPRS worker threads 940. GPRS worker threads 940 can receive retrieve incoming connections from service queue 930 and service them. To service an incoming connection, GPRS worker threads 940 can authenticate the incoming connection (e.g., recognizing which DCS 305 is sending), add a GPRS server time stamp, store data received through the incoming connection in one or more GPRS server data files 834-836, and close the incoming connection.

In various embodiments of the present invention, one or more GPRS servers 822-824 on boot up can read a configuration file to determine the number of worker threads 940 to initiate. During operation, one or more GPRS servers 822-824 can, at predetermined intervals, (e.g., 1 minute-one hour) read the configuration file and adjust the number of worker threads 940 initiated to the value in the configuration file. This enables one or more GPRS servers 822-824 to adjust capacity based upon available computing resources without disrupting the operation of the GPRS servers 822-824 (e.g., rebooting).

As shown in FIG. 9, worker thread 940 can service a connection stored in service queue 930. Service queue 930 is read at step 945 to start processing a connection held in service queue 930. In step 950, the data is received and authenticated. In step 955, the data is stored in an appropriate data file. The data file may be transmitted, as shown in FIG. 8, periodically to central database 560. In step 960, the connection is closed.

Referring back to FIG. 8, GPRS server data files 834-836 can be marked with an identifier of the GPRS system 822-824 on which the GPRS server data file 834-836 is stored. In various embodiments of the present invention, GPRS server 822-824 stores data in one-hour sections for each of ESP 200 and can transmit GPRS server data file 834-836 every hour. GPRS data sender 842-844 can send GPRS server data file 834-836 to data grabber 860 through data transceivers 846-848.

SMS servers 818-820 can send and receive SMS data 806-808 through a communications network 500 (e.g., global system for mobile communications (GSM)). FIG. 10 illustrates an example SMS server architecture 1000 performed on one or more SMS servers 818-820. SMS server architecture 1000 can include an SMS listener thread 1015 which can detect and accept incoming connections in step 1020, read SMS data and queue incoming connections in read SMS queue 1030 in step 1022. In step 1024, the SMS connection is logged in a log file. SMS server architecture 1000 can also have one or more SMS worker threads 1040. SMS worker threads 1040 can retrieve incoming connections from read SMS queue 1030 and service them. As shown in FIG. 10, worker threads 1040 can read the SMS from queue 1030, add a timestamp, add to the logfile, and authenticate the sender. If authenticated, the data can be processed and stored in a data file corresponding to one of SMS server data files 830-832 in step 1044.

Figure 11:
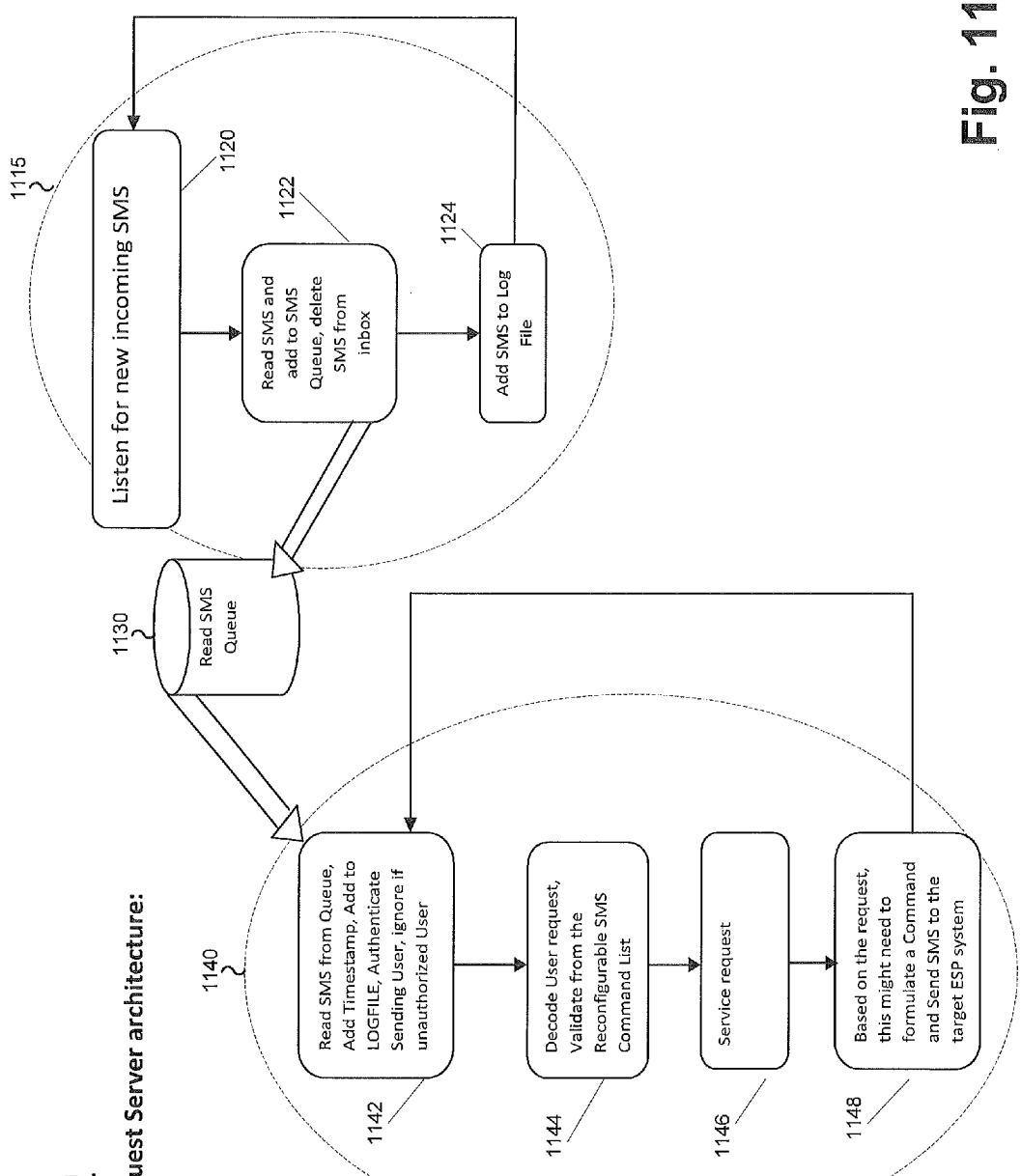
FIG. 11 is simplified block diagram of a user request server architecture consistent with some embodiments of the present invention.

As shown in FIG. 8, user request servers 814-816 can send and receive requests from users 802-804 through a communications network (e.g., GSM). FIG. 11 illustrates an example SMS server architecture 1100 performed on one or more SMS servers 818-820. User request server architecture 1100 can include an SMS listener thread 1115, which can detect and accept incoming connections in step 1120 and queue incoming connections in read SMS queue 1130 in step 1122. The SMS connection can be added to a log file in step 1124. SMS server architecture 1100 can also have one or more SMS worker threads 1140. SMS worker threads 1140 can retrieve incoming connections from read SMS queue 1130 and service them. To service an incoming connection, worker threads 1140 can authenticate the incoming connection (e.g., recognizing which user is sending the request), add an SMS server time stamp, log request, and authenticate the sending user in step 1142. In step 1144, the user request can be decoded and validated in step 1144. After validating the SMS command with an SMS command list, the request can be served in step 1146. The SMS command list can be checked by user request server 814-816 for every user request received. In some embodiments of the present invention, SMS command list is not hard-coded in user request server 814-816 and can be added to, subtracted from, and/or modified without disrupting the operation of user request server 814-816 (e.g., reboot). In step 1148, a command may be sent to an ESP system.

Test servers 886-888 can send and receive test fixture data 882-884 through a communications network (e.g., Ethernet).

Figure 12:
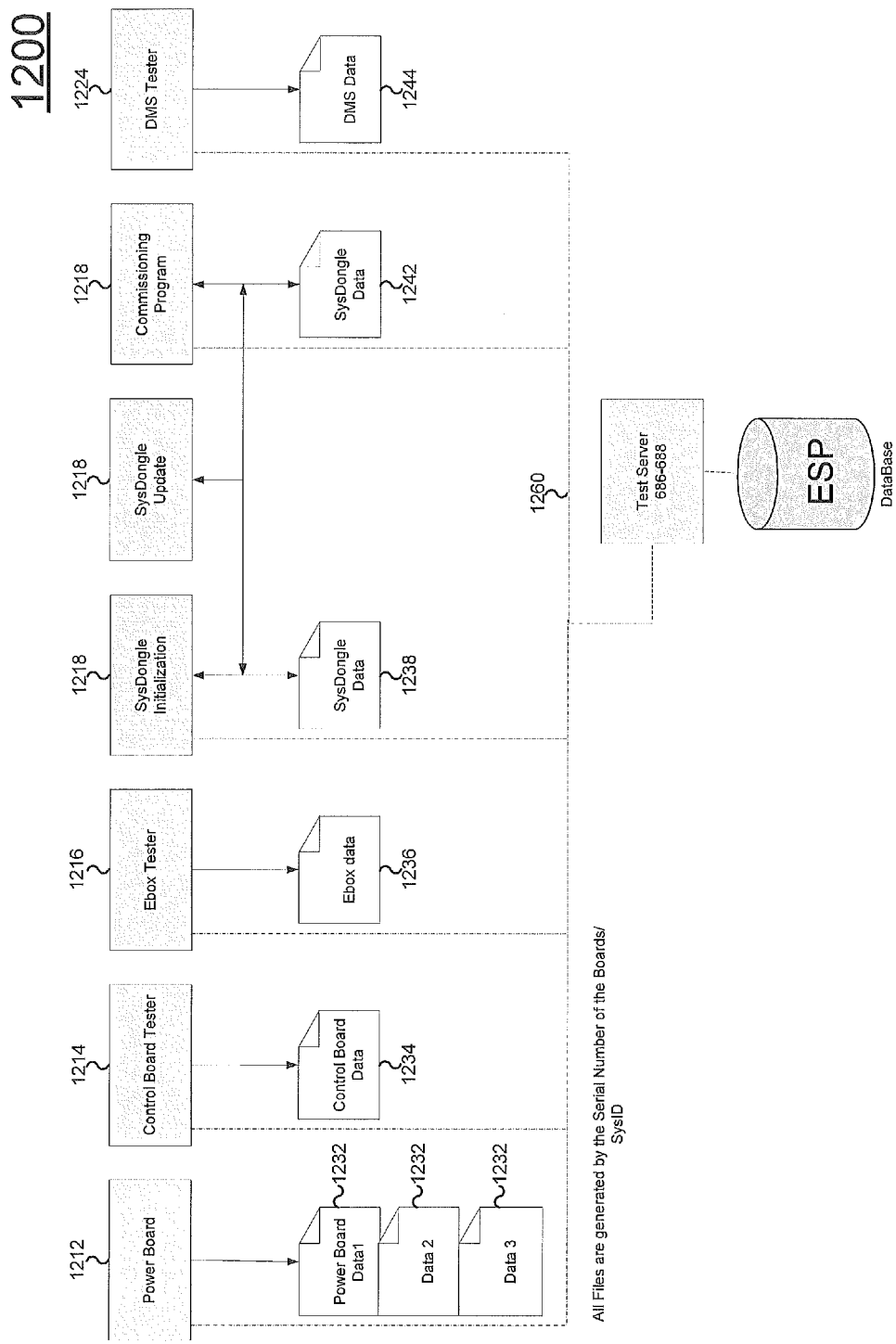
FIG. 12 is simplified block diagram of a test data model consistent with some embodiments of the present invention.

FIG. 12 illustrates an example data model 1200 for test fixture data 882-884. Test fixtures can include power board tester 1212, control board tester 1214, Ebox tester 1216, system dongle setup 1218, and DMS tester 1224. Power board tester 1212 can test power boards (e.g., switched mode power supply) which supply power to ESP 595. In certain embodiments of the present invention, power boards can be a buck boost converter. Power board tester 1212 can, for example, measure efficiency of the power board by varying the load and test its operation. Measurements and optionally analysis of measurements by power board tester 1212 are collected as power board data 1232 and sent over communications network 1260 (e.g., Ethernet) to one or more test servers 886-888.

Control board tester 1214 can test control boards which control operation of ESP 595. Control board tester 1214 can, for example, test sensor inputs, test outputs, and perform functional testing. Test results and optionally analysis of test results by control board tester 1214 are collected as control board data 1234 and sent over communications network 1260 (e.g., Ethernet) to one or more test servers 886-888.

Ebox tester 1216 can test Ebox which houses components such as power boards and controls boards. In certain embodiments of the present invention, Ebox contains two power boards and one control board. Ebox tester 1216 can, for example, test control functions under load, Ebox in different operating modes, memory, inputs, and outputs. Test results and optionally analysis of test results by Ebox tester 1216 are collected as Ebox data 1236 and sent over communications network 1260 (e.g., Ethernet) to one or more test servers 886-888.

SysDongle setup 1218 can test dongles which can be used to operate ESP 595. SysDongle setup 1218 can, for example, perform a functional test (e.g., test communications and onboard memory), write default data (e.g., information for communications with servers 814-824), system identification (e.g., serial number or other identifier), and dongle identification (e.g., serial number or other identifier). Measurements and optionally analysis of measurements by SysDongle setup 1218, and data written to dongle (e.g., dongle identification) are collected as Sysdongle data 1238-1242 and sent over communications network 1060 (e.g., Ethernet) to one or more test servers 886-888.

DMS tester 1224 can test DMS 305. DMS tester 1224 can, for example, test modem functionality, server connectivity, inputs, outputs, and communications protocols. Test results and optionally analysis of test results by DMS tester 1224 are collected as DMS data 1244 and sent over communications network 1260 (e.g., Ethernet) to one or more test servers 886-888. In certain embodiments of the present invention, when communications network 1260 is disrupted, testers 1212-1224 can transmit data to test servers 886-888 when communications network 1260 is restored.

Referring back to FIG. 8, servers 814-824 can have transceiver 838-844 to communicate with central database 670. Transceiver 838-844 can be the interface for servers 814-824 and data grabber 660 can be the interface for central database 670. Data grabber 660 can process data before it is stored in central database 670. Transceivers can perform time synchronization for one or more of servers 814-824, list synchronization with servers 814-824 through central database 670, and accumulate data from servers 814-824 for storage in central database 560. List synchronization can be when system list (e.g., list of registered systems with phone numbers), authorized user list (e.g., list of authorized users and respective privileges), SMS command list (e.g., list of SMS commands and respective access control information), and the like in servers 814-824 are synchronized with lists in central database 560.

Database 560 can have data grabber 860 communicate with servers 814-824. Data grabber 860 can propagate changes to the list of ESP 200 systems, process data before it is stored in database 560, and synchronize messages from servers 814-824.

As one of ordinary skill can in the art can appreciate, servers 802-812 and 886-888, and central data base 870 each can reside on the same physical server, on individual physical servers, or in various combinations of physical servers.

Further embodiments can be envisioned to one of ordinary skill in the art after reading this disclosure. In other embodiments, combinations or sub-combinations of the above disclosed invention can be advantageously made. The specification and drawings are, accordingly, to be regarded in an illustrative rather than restrictive sense. It will, however, be evident that various modifications and changes may be made thereunto without departing from the broader spirit and scope of the invention as set forth in the claims.

What is claimed is:

1. A monitoring system, comprising:
a microprocessor configured to receive a system identifier and data from an energy storage device and from external sensors;
a communications device coupled to the microprocessor; and
memory coupled to the microprocessor to store data;
wherein the monitoring system is configured to operate in multiple states, the multiple states comprising:
a first state, wherein in the first state, the communication device is configured to:
transmit system information to each of a plurality of servers external to the monitoring system to register the monitoring system with the plurality of servers, the system information comprising the system identifier; and
receive an acknowledgement to the transmitted system information from each of the plurality of servers; and
a second state, wherein in the second state, the communication device is configured to:
transmit a copy of the received data to one or more of the plurality of servers;
support a plurality of messaging services; and
communicate with each of the plurality of servers using a respective messaging service selected from the plurality of messaging services;
wherein the monitoring system transitions from the first state to the second state after receiving the acknowledgement from each of the plurality of servers.

2. The system of claim 1, wherein the multiple states further comprise:
a third state for determining a type of the respective messaging service used to communicate with each of the plurality of servers; and
one or more transmit or receive states coupled to the second state;
wherein:
the monitoring system transitions from the third state to the second state when the type of respective messaging service is determined, and wherein the monitoring system transitions from the second state to one or more transmit or receive states based on said type of respective messaging service.

3. The system of claim 2, wherein the one or more transmit or receive states includes a send GPRS state and a receive GPRS state.

4. The system of claim 2, wherein the one or more transmit or receive states includes a send SMS state and a receive SMS state.

5. The system of claim 2, wherein the multiple states further include a fourth state, wherein in the fourth state, the monitoring system retrieves the system identifier from the energy storage device.

6. The system of claim 1, wherein the communication device is further configured to:
transmit the copy of the received data to a first server selected from the plurality of servers; and
transmit the copy of the received data to a second server selected from the plurality of servers when the transmission to the first server is not successful, the second server being different from the first server.

7. The system of claim 1, wherein if no server from the plurality of servers is available, the monitoring system stores the data for later transmission to at least one available server from the plurality of servers.

8. The system of claim 1, wherein each acknowledgement received indicates validation of the monitoring system by a respective one of the plurality of servers.

9. The system of claim 1, wherein the energy storage device receives a time acknowledgment from the microprocessor.

10. The system of claim 9, wherein the energy storage device utilizes the time acknowledgment from the microprocessor to time stamp at least one event.

11. The system of claim 1, further including a power supply that receives power from the energy storage device, from a battery, or from an external power source depending on availability, wherein the monitoring system can continue to monitor the energy storage device and or the external sensor under any power circumstance.

12. A communications system, comprising:
a server system including a plurality of different servers;
one or more monitoring systems, each of the one or more monitoring systems being coupled to a respective energy storage device and the plurality of different servers; and
a data base coupled to the server system;
wherein each of the one or more monitoring systems is configured to operate in multiple states, the multiple states comprising:
a first state, wherein in the first state, each monitoring system is configured to:
receive a system identifier from the respective energy storage device;
transmit system information to each of the plurality of servers to register the monitoring system with the plurality of servers, the system information comprising the system identifier; and
receive an acknowledgement to the transmitted system information from the plurality of servers; and
a second state, wherein in the second state, the monitoring system is configured to:
support a plurality of messaging services; and
transmit data from the respective energy storage device to at least one of the plurality of servers using a respective messaging service selected from the plurality of messaging services;
wherein the monitoring system transitions from the first state to the second state after receiving the acknowledgement from each of the plurality of servers, and wherein the transmitted data is stored in the data base.

13. The communications system of claim 12, wherein the plurality of servers includes one or more GPRS based servers.

14. The communications system of claim 12, wherein the plurality of servers includes one or more SMS based servers.

15. The communications system of claim 12, wherein the plurality of servers includes one or more user request servers.

16. The communications system of claim 12, wherein the plurality of servers includes one or more test servers for sending and receiving test fixture data through a network to one or more test fixtures.

17. The communication system of claim 12, wherein the server system can provide commands to at least one of the monitoring systems.

18. The communications system of claim 12, wherein data from at least one of the monitoring systems is analyzed to provide performance and maintenance reports.

19. A method of monitoring an energy storage device, comprising:
performing a first process comprising the steps of:
transmitting system information to each of a plurality of servers external to a monitoring system to register the monitoring system with the plurality of servers; and
receiving an acknowledgement to the transmitted system information from each of the plurality of servers; and
performing a second process comprising the steps of:
collecting data from the energy storage device using the monitoring system;
transmitting a copy of the data to a first server selected from the plurality of servers using a respective messaging service selected from a plurality of messaging services supported by the monitoring system; and
transmitting, when the transmitting to the first server is not successful, the copy of the data to a second server selected from the plurality of servers, the second server being different from the first server;
wherein the second process is performed after receiving the acknowledgement from each of the plurality of servers during the first process.

20. The method of claim 19, wherein the second process further includes the steps of:
determining that none of the second plurality of servers is available; and
storing the data for a period of time before reporting the data to at least one of the second plurality of servers that become available.

21. The method of claim 19, wherein transmitting the copy of the data includes determining a type of each of the respective messaging services.

22. The method of claim 19, wherein the first process further comprises retrieving a system identifier from the energy storage device, wherein the system information comprises the system identifier.

* * * * *